(12) United States Patent
Parkin

(10) Patent No.: US 7,570,463 B2
(45) Date of Patent: *Aug. 4, 2009

(54) MAGNETIC TUNNEL JUNCTIONS INCLUDING CRYSTALLINE AND AMORPHOUS TUNNEL BARRIER MATERIALS

(75) Inventor: Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/146,286

(22) Filed: Jun. 25, 2008

(65) Prior Publication Data

US 2008/0291584 A1    Nov. 27, 2008

Related U.S. Application Data

(63) Continuation of application No. 11/099,184, filed on Apr. 4, 2005, now Pat. No. 7,443,639.

(51) Int. Cl.
*G11B 5/39* (2006.01)
(52) U.S. Cl. .................................. 360/324.2
(58) Field of Classification Search ............... 360/324.2
See application file for complete search history.

(56) References Cited

U.S. PATENT DOCUMENTS

| 6,347,049 | B1* | 2/2002 | Childress et al. ......... 360/324.2 |
| 6,674,617 | B2 | 1/2004 | Gill |
| 6,767,655 | B2 | 7/2004 | Hiramoto et al. |
| 7,270,896 | B2 | 9/2007 | Parkin |
| 7,276,384 | B2 | 10/2007 | Parkin et al. |
| 7,345,855 | B2* | 3/2008 | Parkin ...................... 360/324.2 |
| 7,349,187 | B2* | 3/2008 | Parkin ...................... 360/324.2 |
| 7,351,483 | B2 | 4/2008 | Parkin |
| 7,357,995 | B2 | 4/2008 | Parkin |
| 7,443,639 | B2* | 10/2008 | Parkin ...................... 360/324.2 |
| 2002/0114112 | A1* | 8/2002 | Nakashio et al. ......... 360/324.2 |
| 2003/0008416 | A1* | 1/2003 | Shimura et al. ................ 438/3 |
| 2007/0259213 | A1 | 11/2007 | Hashimoto et al. |
| 2008/0138660 | A1 | 6/2008 | Parkin |
| 2008/0145952 | A1 | 6/2008 | Parkin |
| 2008/0182015 | A1 | 7/2008 | Parkin |
| 2008/0182342 | A1 | 7/2008 | Parkin |
| 2008/0291584 | A1 | 11/2008 | Parkin |

OTHER PUBLICATIONS

Nishimura et al.; Magnetic tunnel junction device with perpendicular magnetization films for high-density magnetic random access memory; (J. App. Phys., V91(8), Apr. 2002, pp. 5246-5249.

* cited by examiner

*Primary Examiner*—Craig A Renner
(74) *Attorney, Agent, or Firm*—Daniel E. Johnson

(57) ABSTRACT

Magnetic tunnel junctions are disclosed that include ferromagnetic (or ferrimagnetic) materials and a bilayer tunnel barrier structure. The bilayer includes a crystalline material, such as MgO or Mg—ZnO, and $Al_2O_3$, which may be amorphous. If MgO is used, then it is preferably (100) oriented. The magnetic tunnel junctions so formed enjoy high tunneling magnetoresistance, e.g., greater than 100% at room temperature.

25 Claims, 12 Drawing Sheets

MAGNETIC TUNNEL JUNCTIONS INCLUDING CRYSTALLINE AND AMORPHOUS TUNNEL BARRIER MATERIALS

This application is a continuation of Applicant's copending U.S. application Ser. No. 11/099,184 filed Apr. 4, 2005 and entitled "Magnetic Tunnel Junctions Including Crystalline and Amorphous Tunnel Barrier Materials", which is hereby incorporated by reference.

This invention was made with Government support under Contract No. MDA972-01-C-0051 awarded by DARPA. The Government has certain rights in the invention.

TECHNICAL FIELD

The invention relates to magnetic tunnel junction (MTJ) magnetoresistive (MR) devices for use as magnetic field sensors such as read heads for reading magnetically recorded data, as memory cells in nonvolatile magnetic random access memory (MRAM) cells, and for magnetic logic and spintronic applications. More particularly, this invention relates to an improved MTJ exhibiting high tunneling magnetoresistance using a composite tunnel barrier formed from crystalline and amorphous dielectric layers.

BACKGROUND OF THE INVENTION

The basic component of a magnetic tunnel junction is a sandwich of two thin ferromagnetic and/or ferrimagnetic layers separated by a very thin insulating layer through which electrons can tunnel. The tunneling current is typically higher when the magnetic moments of the ferromagnetic (F) layers are parallel and lower when the magnetic moments of the two ferromagnetic layers are anti-parallel. The change in conductance for these two magnetic states can be described as a magneto-resistance. Here the tunneling magnetoresistance (TMR) of the MTJ is defined as $(R_{AP}-R_P)/R_P$ where $R_P$ and $R_{AP}$ are the resistance of the MTJ for parallel and anti-parallel alignment of the ferromagnetic layers, respectively. MTJ devices have been proposed as memory cells for nonvolatile solid state memory and as external magnetic field sensors, such as TMR read sensors for heads for magnetic recording systems. For a memory cell application, one of the ferromagnetic layers in the MTJ is the reference layer and has its magnetic moment fixed or pinned, so that its magnetic moment is unaffected by the presence of the magnetic fields applied to the device during its operation. The other ferromagnetic layer in the sandwich is the storage layer, whose moment responds to magnetic fields applied during operation of the device. In the quiescent state, in the absence of any applied magnetic field within the memory cell, the storage layer magnetic moment is designed to be either parallel (P) or anti-parallel (AP) to the magnetic moment of the reference ferromagnetic layer. For a TMR field sensor for read head applications, the reference ferromagnetic layer has its magnetic moment fixed or pinned so as to be generally perpendicular to the magnetic moment of the free or sensing ferromagnetic layer in the absence of an external magnetic field. The use of an MTJ device as a memory cell in an MRAM array is described in U.S. Pat. No. 5,640,343. The use of an MTJ device as a MR read head has been described in U.S. Pat. Nos. 5,390,061; 5,650,958; 5,729,410 and 5,764,567.

FIG. 1A illustrates a cross-section of a conventional prior-art MTJ device. The MTJ 100 includes a bottom "fixed" or "reference" ferromagnetic (F) layer 15, an insulating tunnel barrier layer 24, and a top "free" or "storage" ferromagnetic layer 34. The MTJ 100 has bottom and top electrical leads 12 and 36, respectively, with the bottom lead being formed on a suitable substrate 11, such as a silicon oxide layer. The ferromagnetic layer 15 is called the fixed (or reference) layer because its magnetic moment is prevented from rotating in the presence of an applied magnetic field in the desired range of interest for the MTJ device, e.g., the magnetic field caused by the write current applied to the memory cell from the read/write circuitry of the MRAM. The magnetic moment of the ferromagnetic layer 15, whose direction is indicated by the arrow 90 in FIG. 1A, can be fixed by forming it from a high coercivity magnetic material or by exchange coupling it to an antiferromagnetic layer 16. The magnetic moment of the free ferromagnetic layer 34 is not fixed, and is thus free to rotate in the presence of an applied magnetic field in the range of interest. In the absence of an applied magnetic field, the moments of the ferromagnetic layers 15 and 34 are aligned generally parallel (or anti-parallel) in an MTJ memory cell (as indicated by the double-headed arrow 80 in FIG. 1A) and generally perpendicular in a MTJ magnetoresistive read head. The relative orientation of the magnetic moments of the ferromagnetic layers 15, 34 affects the tunneling current and thus the electrical resistance of the MTJ device. The bottom lead 12, the antiferromagnetic layer 16, and the fixed ferromagnetic layer 15 together may be regarded as constituting the lower electrode 10.

The basic concept of a magnetic tunnel junction was first realized in 1975 (M. Julliere, "Tunneling between ferromagnetic films", Phys. Lett. 54A, 225 (1975)), although the TMR was very small and observed only at low temperatures and for very small bias voltages. In 1995 significant TMR effects of about 10% were obtained at room temperature in MTJs with $Al_2O_3$ tunnel barriers by two different groups (J. S. Moodera et al., "Large magnetoresistance at room temperature in ferromagnetic thin film tunnel junctions", Phys. Rev. Lett. 74, 3273 (1995); and T. Miyazaki and N. Tezuka, "Giant magnetic tunneling effect in $Fe/Al_2O_3/Fe$ junction", J. Magn. Magn. Mat. 139, L231 (1995)). Subsequently, S. S. P. Parkin et al. ("Exchange-biased Magnetic Tunnel Junctions and Application to Non-Volatile Magnetic Random Access Memory", J. Appl. Phys. 85, 5828 (1999)) obtained effects as large as about 48-50% by optimizing the growth of the $Al_2O_3$ tunnel barrier, by optimizing the interface between the $Al_2O_3$ tunnel barrier and the ferromagnetic electrodes, and by carefully controlling the magnetic orientation of the ferromagnetic moments using concepts of magnetic engineering, in particular, exchange bias (see U.S. Pat. No. 5,650,958 titled "Magnetic tunnel junctions with controlled magnetic response" to W. J. Gallagher et al.) and an anti-parallel coupled pinned ferromagnetic layer (see U.S. Pat. No. 5,841,692 titled "Magnetic tunnel junction device with antiferromagnetically coupled pinned layer" to W. J. Gallagher et al.).

The magnetoresistance of MTJs using aluminum oxide tunneling barriers is limited to about 50% at room temperature (S. S. P. Parkin et al., "Exchange-biased Magnetic Tunnel Junctions and Application to Non-Volatile Magnetic Random Access Memory", J. Appl. Phys. 85, 5828 (1999); X.-F. Han et al., "Fabrication of high-magnetoresistance tunnel junctions using $Co_{75}Fe_{25}$ ferromagnetic electrodes", Appl. Phys. Lett. 77, 283 (2000)), although there have been reports of TMR values of up to 70% at room temperature using CoFeB ferromagnetic electrodes (Tsunekawa et al., "Over 70% TMR at Room Temperature in MTJ films with various SAF configurations", MMM-Intermag conference, Anaheim (2004) and Wang et al., "70% TMR at room temperature for SDT sandwich junctions with CoFeB as free and reference layers", IEEE Trans. Magn. 40, 2269 (2004)).

For applications of magnetic tunnel junctions for either magnetic recording heads or for non-volatile magnetic memory storage cells, high TMR values are needed for improving the performance of these devices. The speed of operation of the recording head or memory is related to the signal to noise ratio (SNR) provided by the MTJ—higher TMR values will lead to higher SNR values for otherwise the same resistance. Moreover, for memory applications, the larger the TMR, the greater is the variation in resistance of the MTJs from device to device which can be tolerated. Since the resistance of an MTJ depends exponentially on the thickness of the tunneling barrier, small variations in thickness can give rise to large changes in the resistance of the MTJ. Thus high TMR values can be used to mitigate inevitable variations in tunnel barrier thickness from device to device. The resistance of an MTJ device increases inversely with the area of the device. As the density of memory devices increases in the future, the thickness of the tunnel barrier will have to be reduced (for otherwise the same tunnel barrier material) to maintain an optimal resistance of the MTJ memory cell for matching to electronic circuits. Thus a given variation in thickness of the tunnel barrier (introduced by whatever process is used to fabricate the MTJ) will become an increasingly larger proportion of the reduced tunnel barrier thickness and so will likely give rise to larger variations in the resistance of the MTJ device.

U.S. patent application Ser. No. 10/973,954 to Parkin titled "MgO tunnel barriers and method of formation" (filed Oct. 25, 2004), which is hereby incorporated by reference, discloses a method of forming a tunnel barrier comprised of magnesium oxide (MgO) with which magnetic tunnel junctions can be deposited which exhibit tunneling magnetoresistance values of more than 100% at low bias. The tunnel barrier is formed by first depositing a thin layer of Mg using, for example, magnetron or ion beam sputter deposition followed by a layer of Mg deposited in the presence of oxygen. In addition, Parkin discloses methods of forming highly oriented crystalline MgO tunnel barriers by forming the MgO barrier on a ferromagnetic electrode comprised of a Co—Fe alloy, which is bcc and (100) textured. The CoFe electrode is formed on a (100) oriented antiferromagnetic layer of fcc IrMn which itself is grown highly oriented by forming this layer on suitable underlayers, for example, a combination of a TaN layer followed by a Ta layer.

Useful MTJ devices for magnetic recording read heads or for MRAM memory cells will be of sub-micron dimensions. This leads to very large self-demagnetizing for devices which are not circular in cross-section and very large magnetostatic coupling fields between ferromagnetic layers in the same device. For example, in the conventional device shown in FIG. 1A, there will be a very large interaction between the pinned ferromagnetic layer 15 and the free or storage ferromagnetic layer 34 because of magnetic poles formed at the edges of the device 100. These coupling fields are so large as to make such devices typically unworkable because the direction of the magnetic moment of the storage layer 34, indicated by the arrow 80 in FIG. 1A, will preferentially be oriented antiparallel to that of the direction of the magnetic moment of the fixed ferromagnetic layer 15, indicated by the arrow 90 in FIG. 1A.

One method to solve this problem was first proposed by Parkin and Heim with reference to metallic spin-valve giant magnetoresistance sensors in U.S. Pat. No. 5,465,185, wherein the reference ferromagnetic layer 15 is replaced by a sandwich of two ferromagnetic layers 18 and 19 antiferromagnetically coupled through a metallic spacer layer 17 as shown by the MTJ 100' of FIG. 1B. The lower electrode is now given by the reference numeral 10', and the magnetic orientation of the layers 18 and 19 is given by the arrows 90' and 95, respectively. Parkin showed that the spacer layer can be comprised of a wide variety of non-magnetic metals chosen from the groups of the $3d$, $4d$, and $5d$ transition metals as well as the noble metals Cu, Au and Ag, such that the layers 18 and 19 are indirectly exchange coupled through the metallic spacer layer 17 (S. S. P. Parkin et al. "*Oscillations in Exchange Coupling and Magnetoresistance in Metallic Superlattice Structures: Co/Ru, Co/Cr and Fe/Cr*", Phys. Rev. Lett. 64, 2304 (1990) and S. S. P. Parkin, "*Systematic Variation of Strength and Oscillation Period of Indirect Magnetic Exchange Coupling through the $3d$, $4d$ and $5d$ Transition Metals*", Phys. Rev. Lett. 67, 3598 (1991)).

For certain thicknesses of the spacer layer 17, the magnetic moments of the ferromagnetic layers 18 and 19 are antiferromagnetically coupled to one another so that the net magnetic moment of the sandwich can be chosen to be arbitrarily small. Consequently, the demagnetization field from the edges of the layer 18 is reduced by the opposite demagnetizing field arising from the poles at the edges of the layer 19. The net demagnetizing field can be zero by proper choice of the thicknesses and the magnetic material forming layers 18 and 19. In particular Parkin (S. S. P. Parkin et al. "*Oscillations in Exchange Coupling and Magnetoresistance in Metallic Superlattice Structures: Co/Ru, Co/Cr and Fe/Cr*", Phys. Rev. Lett. 64, 2304 (1990)) showed that Ru is a highly preferred antiferromagnetic coupling layer because of the large antiferromagnetic (AF) coupling strength exhibited by very thin layers of Ru and because Ru displays large AF coupling for a wide range of ferromagnetic materials. Moreover, structures using Ru antiferromagnetic coupling layers also display high thermal stability. For these reasons the synthetic antiferromagnetic structure formed from the combination of ferromagnetic layers 18 and 19 separated by a thin Ru layer 17 has become the de facto structure of choice for magnetic recording read heads based on giant magnetoresistance as well as for magnetic tunnel junction memory cells based on spin dependent tunneling using amorphous alumina tunnel barriers. The use of synthetic antiferromagnetic reference layers using Ru antiferromagnetic coupling layers for MTJ sensor and memory applications is described in IBM's U.S. Pat. No. 5,841,692 titled "Magnetic tunnel junction device with antiferromagnetically coupled pinned layer" to W. J. Gallagher et al.

It is generally desirable for the ferromagnetic electrodes to be comprised of low magnetization ferromagnetic materials so as to reduce the demagnetization fields from the ferromagnetic electrodes (with or without the use of the synthetic antiferromagnetic structure). A reference layer can be comprised of a single ferromagnetic layer if this layer can be made sufficiently thin so as to have a low enough magnetic moment and corresponding demagnetizing field. Usually, there will be some sort of ferromagnetic coupling of the reference and free layer due to Neel coupling typically associated with correlated roughness of the surfaces of the reference and free layer on either side of the tunneling barrier. This Neel coupling can be balanced by the demagnetizing field to allow for control of the coupling field between the reference and free layers.

In a cross-point MRAM, the MTJ devices are switched by the application of two magnetic fields applied along two orthogonal directions, the easy and hard axes of the MTJ device. Typically the magnetic easy and hard anisotropy axes are defined by the shape of the MTJ element through the self-demagnetizing fields, although the magnetic materials themselves may give rise to an additional uniaxial anisotropy field. The MRAM array will contain a series of MTJ elements arranged along a series of word and bit lines, typically arranged orthogonal to one another. The magnetic switching fields are realized by passing currents along the word and bit lines. All the cells along a particular word or bit line will be subject to the same word or bit line field. Thus the width of the distribution of switching fields for the selected MTJs (those subject to the vector sum of the bit and word line fields) must be sufficiently narrow that it does not overlap the distribution of switching fields for the half-selected devices. The moment within the MTJ devices lies along a particular direction, the easy axis. The orthogonal direction is the magnetic "hard" axis. It is important that the demagnetizing fields from neighboring elements be minimized so that they do not increase the width of the distribution of writing fields. Thus the use of low moment ferromagnetic materials is important in this regard.

In addition to low magnetic moments, it is also preferable that the ferromagnetic material from which the free layer is composed exhibit a well defined uniaxial anisotropy field which, for certain magnetic switching protocols, may need to be as low as a few Oersted. It is very difficult to find a ferromagnetic material which displays such a combination of properties, i.e., low magnetization and small and well defined uniaxial magnetic anisotropy. One such material is permalloy ($Ni_{81}Fe_{19}$).

It is in general desirable for the MTJ to exhibit the largest possible tunneling magnetoresistance, so as to allow for unavoidable cell-to-cell variations in resistance of the MTJ devices within an MRAM array of cells. The methods of forming MTJs with high tunneling magnetoresistance values described in U.S. patent application Ser. No. 10/973,954 to Parkin titled "MgO tunnel barriers and method of formation" (filed Oct. 25, 2004), rely on the MgO tunnel barrier being simple cubic and preferably (100) textured and surrounded on both sides by ferromagnetic layers which are bcc and preferably (100) textured. The preferred materials described in this prior application include alloys of Co and Fe which are bcc. In other US patent applications to Parkin titled "High performance magnetic tunnel barriers with amorphous materials" (application Ser. No. 10/884,831 filed Jul. 2, 2004) and "Magnetic tunnel junctions using amorphous materials as reference and free layers" (application Ser. No. 10/904,449 filed Nov. 10, 2004), both of which are incorporated by reference, the structure and methods of forming MTJs with high tunneling magnetoresistance values are described in which amorphous ferromagnetic electrodes are used in combination with crystalline MgO tunnel barriers. However, these amorphous magnetic materials, which are formed by the incorporation of suitable glass forming elements such as boron, are also formed from alloys of Co and Fe. Such alloys display high uniaxial anisotropy fields. The use of the MgO tunnel barriers precludes the use of many useful ferromagnetic materials such as permalloy.

What is needed is a method of forming MTJs with high tunneling magnetoresistance and ferromagnetic electrodes formed from useful, low moment and low magnetic anisotropy ferromagnetic materials for improved writing performance.

SUMMARY OF THE INVENTION

For a fuller understanding of the nature and advantages of the present invention, reference should be made to the following detailed description taken together with the accompanying figures.

One embodiment of the invention is a device that includes a tunnel barrier structure having a crystalline MgO tunnel barrier in proximity with an $Al_2O_3$ tunnel barrier. The device also includes first and second magnetic materials on different sides of the tunnel barrier structure, in which the first and second magnetic materials are selected from the group of materials consisting of ferromagnetic materials and ferrimagnetic materials. The first magnetic material, the MgO tunnel barrier, the $Al_2O_3$ tunnel barrier, and the second magnetic material are in proximity with each other, thereby enabling spin-polarized current to pass from the first magnetic material, through the MgO tunnel barrier, through the $Al_2O_3$ tunnel barrier, and into the second magnetic material. The device may be constructed so that current passes through the MgO tunnel barrier before passing through the $Al_2O_3$ tunnel barrier, or vice versa. The tunnel barrier structure may also include two or more MgO tunnel barriers, with the $Al_2O_3$ tunnel barrier being sandwiched between two MgO tunnel barriers.

The thickness of the $Al_2O_3$ tunnel barrier is preferably between 2 and 20 angstroms, and may be less than 20-30 angstroms. Preferably, the $Al_2O_3$ tunnel barrier is substantially amorphous and is sufficiently thick that it substantially covers a surface of the MgO tunnel barrier. The thickness of the MgO tunnel barrier is preferably between 3 and 20 angstroms; the MgO tunnel barrier may be (100) oriented or (111) oriented, for example. The tunnel barriers and the magnetic materials may advantageously form a magnetic tunnel junction having a tunneling magnetoresistance of at least 50%, 100%, or even 150% at room temperature.

Another embodiment of the invention is directed to a device that includes a tunnel barrier structure having a crystalline tunnel barrier in proximity with an amorphous tunnel barrier, in which the crystalline tunnel barrier and the amorphous tunnel barrier have different chemical compositions. The device further includes a first layer of magnetic material and a second layer of magnetic material, in which the magnetic materials of the first and second layers are selected from the group of materials consisting of ferromagnetic materials and ferrimagnetic materials. The first magnetic layer, the tunnel barrier structure, and the second magnetic layer are in proximity with each other, thereby enabling spin-polarized current to pass from the first magnetic material, through the tunnel barrier structure, and into the second magnetic material. The crystalline tunnel barrier may include (100) oriented MgO, (111) oriented MgO, and/or Mg—ZnO (of either (100) or (111) orientation), whereas the amorphous tunnel barrier may advantageously include $Al_2O_3$.

Yet another embodiment of the invention is a magnetic tunnel junction that includes first and second layers of magnetic material selected from the group of materials consisting of ferromagnetic materials and ferrimagnetic materials; the magnetic tunnel junction also includes a bilayer of respective tunnel barriers. The bilayer is sandwiched between the first and second magnetic layers, so that the first layer, the bilayer, and the second layer form a magnetic tunnel junction. The bilayer includes i) a layer of amorphous $Al_2O_3$ that forms a first tunnel barrier and ii) a layer of crystalline material that forms a second tunnel barrier, with the crystalline material including at least one of MgO and Mg—ZnO.

The preferred embodiments and implementations herein are directed to structures in which the magnetic material has a body-centered cubic (bcc) lattice, since this lattice type leads to the best performance of the MgO or Mg—ZnO tunnel barrier (e.g., the highest TMR for a tunnel junction). It should be noted, however, that in thin films, because of strain induced by overlayers and/or underlayers, the in-plane and out-of-plane lattice constants may be slightly different, and the lattice may be slightly distorted from the pure bcc case, e.g., as a result of a tetragonal distortion. As used herein, the term "body centered cubic" (bcc) should be construed broadly enough to encompass such deviations from the pure bcc case.

The preferred embodiments and implementations of the invention are directed to magnetic layers and MgO or Mg-ZnO tunnel barrier layers which are substantially (100) oriented or textured. Certain magnetic layers and tunnel barrier layers are polycrystalline and are comprised of grains or crystallites which range in lateral extent from approximately one hundred to several hundred angstroms (e.g., 500 angstroms). Thus, these layers and the overall film structure are what is commonly referred to as textured. Texturing implies that there is a predominant crystallographic orientation of individual layers and/or the overall film structure, but that the grains are not perfectly aligned along one particular direction. Individual grains may not be precisely oriented with their (100) direction along the normal to the film layer, but the (100) direction within individual grains may be oriented away from the normal to the plane of the film by an angle that can vary from a small fraction of one degree to several degrees or even tens of degrees for poorly textured films. The angular range of these (100) directions can be used to quantify the degree of (100) crystalline texture of the film structure and can be measured using various structural characterization techniques, including cross-section transmission electron microscopy and various x-ray diffraction techniques.

There may also be present grains which are oriented in a completely different direction, but the proportion of these grains is small for the method of formation of the magnetic tunnel junction structures described herein. Note that the crystalline grains are randomly oriented with respect to a direction within the plane of the substrate on which the film structures are grown. It is the orientation or texturing of the film which is important with regard to the preferred embodiments herein. Whereas the maximum TMR is obtained for film structures which are highly textured, the TMR will be increased to the extent that the film structure is textured. It is preferred that the angular range of a (100) direction within the grains be within + or −20 degrees of the film normal, or more preferably within + or −10 degrees, and even more preferably within + or −5 degrees. As used herein, the term "(100) oriented" should be understood to include the aforementioned deviations from the ideal case, in which all the grains are precisely oriented with their (100) direction along the normal to the film layer.

Notwithstanding the polycrystalline nature of the film structures described herein, which are in any case preferable for ease of manufacturing, the method of forming the MgO (or Mg—ZnO) tunnel barrier described herein can also be applied to the growth of epitaxial single crystalline film structures, wherein the structures are prepared on a face of a single crystalline substrate chosen so that the crystalline spacing and crystalline cell is compatible with the growth of a bcc ferromagnetic metal layer oriented in the (100) growth direction and the subsequent growth of a MgO (or Mg—ZnO) tunnel barrier according one of the preferred embodiments described herein.

BRIEF DESCRIPTION OF THE DRAWINGS

FIG. 1, which includes FIG. 1A shows a magnetic tunnel junction with a reference and a storage ferromagnetic layer, and FIG. 1B shows a magnetic tunnel junction device with a reference layer (formed from a synthetic antiferromagnet) and a storage ferromagnetic layer.

FIGS. 4A and 4B, shows the dependence of tunneling magnetoresistance on the applied magnetic field in the plane of a magnetic tunnel junction device for the structure shown in FIG. 3A for the various indicated thicknesses x of a crystalline MgO tunnel barrier layer and the indicated thicknesses y of an amorphous alumina tunnel barrier layer, the two layers together forming the tunnel barrier of the MTJ device. FIG. 4A shows a sequence of major loops and FIG. 4B shows a sequence of minor loops at room temperature after an anneal treatment at 320 C for 30 minutes in a high vacuum anneal furnace in an in-plane magnetic field of 1 Tesla.

FIGS. 5A and 5B, shows the dependence of the tunneling magnetoresistance (in FIG. 5A) and the resistance (in FIG. 5B) for an MTJ of the present invention that uses a tunnel barrier formed from a combination of a crystalline MgO layer of thickness $t_{MgO}$ indicated in the figure and an alumina layer of thickness indicated by the abscissa of the plot. Data are shown for two sets of devices with different capping layers as shown in the figure and for two different annealing temperatures.

FIGS. 6A and 6B, shows the dependence of tunneling magnetoresistance on the applied magnetic field in the plane of a magnetic tunnel junction device for the structure shown in FIG. 3B for the various indicated thicknesses x of an upper crystalline MgO tunnel barrier layer and the indicated thicknesses y of an amorphous alumina tunnel barrier layer; these two layers together with a lower crystalline MgO layer form the tunnel barrier of the MTJ device. FIG. 6A shows a set of major loops and FIG. 6B shows a corresponding set of minor loops at room temperature after an anneal treatment at 320 C for 30 minutes in a high vacuum anneal furnace in an in-plane magnetic field of 1 Tesla.

FIGS. 7A and 7B, shows the dependence of the tunneling magnetoresistance (in FIG. 7A) and the resistance (in FIG. 7B) for an MTJ of the present invention that uses a tunnel barrier formed from a combination of a lower crystalline MgO layer, a middle alumina layer of thickness indicated by the abscissa of the plot and an upper crystalline MgO layer of thickness $t_{MgO}$ indicated in the figure. Data are shown for a set of devices after annealing at two different annealing temperatures indicated in the figure.

FIGS. 8A and 8B, shows the dependence of the $V_{50}$, the voltage at which the tunneling magnetoresistance is reduced by one half, and the difference in the $V_{50}$ values for positive and negative bias voltages (in FIG. 8A) and the tunnel barrier height and width (in FIG. 8B), as inferred from fitting current versus voltage curves using the well-known Brinkman formula, as a function of alumina layer thickness for a structure of the current invention according to FIG. 3A.

DESCRIPTION OF THE PREFERRED EMBODIMENTS

Figure 1A:
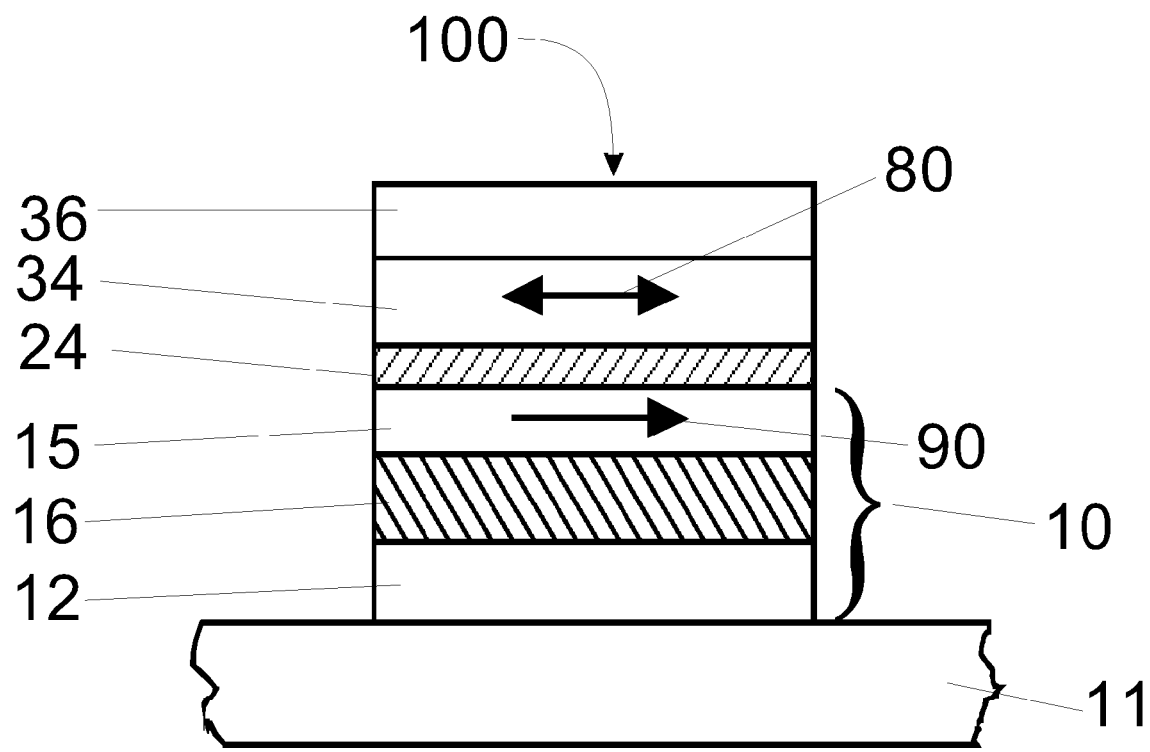
FIGS. 1A and 1B, is a schematic of a magnetic tunnel junction formed in accordance with the prior art.

The tunneling current in an MTJ is spin polarized, which means that the electrical current passing from one of the ferromagnetic layers is predominantly composed of electrons of one spin type (spin up or spin down, depending on the orientation of the magnetization of the ferromagnetic layer). The tunneling spin polarization P of the current can be inferred from a variety of different measurements. The measurement most relevant to magnetic tunneling is to measure the conductance as a function of bias voltage for junctions formed from a sandwich of the ferromagnetic material of interest and a superconducting counter electrode (R. Meservey and P. M. Tedrow, Phys. Rep. 238, 173 (1994)). These studies show that the spin polarization of the tunnel current measured in this way can be simply related to the TMR close to zero bias voltage as first proposed by Julliere (M. Julliere, Phys. Lett. 54A, 225 (1975)). In such a model P is defined as $(n_\uparrow - n_\downarrow)/(n_\uparrow + n_\downarrow)$, where $n_\uparrow$ and $n_\downarrow$ are the density of spin up and spin down states at the ferromagnet/insulator interface. By assuming that the tunnel current is comprised of two independent majority and minority spin currents and that these currents are related to the respective density of states of the majority and minority carriers in the opposing ferromagnetic electrodes, the TMR can be formulated by the relation $TMR = (R_{AP} - R_P)/R_P = 2P_1P_2/(1 - P_1P_2)$, where $R_{AP}$ and $R_P$ are the resistances of the MTJ for anti-parallel and parallel orientation of the ferromagnetic electrodes, respectively, and $P_1$ and $P_2$ are the spin polarization values of the two ferromagnetic electrodes.

Experimentally, it is clear that the magnitude of the TMR is extremely sensitive to the nature of the interface between the tunneling barrier and the ferromagnetic electrode. By changing the properties of the interface layer, for example, by inserting very thin layers of non-magnetic metals between the ferromagnet and the insulator layers, the TMR can be dramatically altered. Based on such observations, most experimental data on magnetic tunneling have usually been interpreted by assuming that P is largely determined by the electronic structure of the ferromagnetic interface layer essentially independent of the tunnel barrier electronic structure. However, it is now recognized that P can be strongly influenced by the probability of tunneling of electrons which depends not only on their spin but also on the tunneling matrix element. The tunneling matrix element is determined by the detailed electronic structure of the ferromagnetic, the tunnel barrier, and the interface between the ferromagnetic electrode and the tunnel barrier. For the same ferromagnetic electrode, the polarization of the tunneling current P varies depending on the material and structure of the tunnel barrier.

The possibility of high tunneling magnetoresistance in MTJs formed from Fe/MgO/Fe sandwiches where the tunnel barrier is formed from crystalline (100) oriented MgO layers was theorized by W. H. Butler, X.-G. Zhang, T. C. Schulthess et al., Phys. Rev. B 63, 054416 (2001). The high TMR results from the very slow decay through the tunnel barrier of majority electrons of a particular symmetry for the (100) orientation of Fe/MgO. This also means that the polarization of the tunneling electrons should also be very high. However, extensive experimental work by many groups over a period of several years showed no evidence for improved tunneling magnetoresistance values using crystalline (100) MgO tunnel barriers as compared to amorphous alumina tunnel barriers. It was speculated that during the formation of the MgO tunnel barrier, the surface of the lower Fe electrode became oxidized perhaps resulting in much lower TMR than theorized. In U.S. patent application Ser. No. 10/973,954 to Parkin titled "MgO tunnel barriers and method of formation" (filed Oct. 25, 2004), a method for forming MgO tunnel barriers is described which gives rise to MTJs which exhibit extraordinarily high values of tunneling magnetoresistance. To prevent the oxidation of a lower electrode formed from Fe, a method of forming the MgO barrier was developed in which a thin layer of metallic Mg was first deposited on top of the Fe layer and then a layer of MgO was deposited on top of this Mg layer through the reactive sputtering of Mg in an Ar—$O_2$ plasma. Using this method of preparing the MgO barrier, very high tunneling magnetoresistance values were obtained, much higher than any previously reported values for any MTJ at room temperature.

Figure 2A:
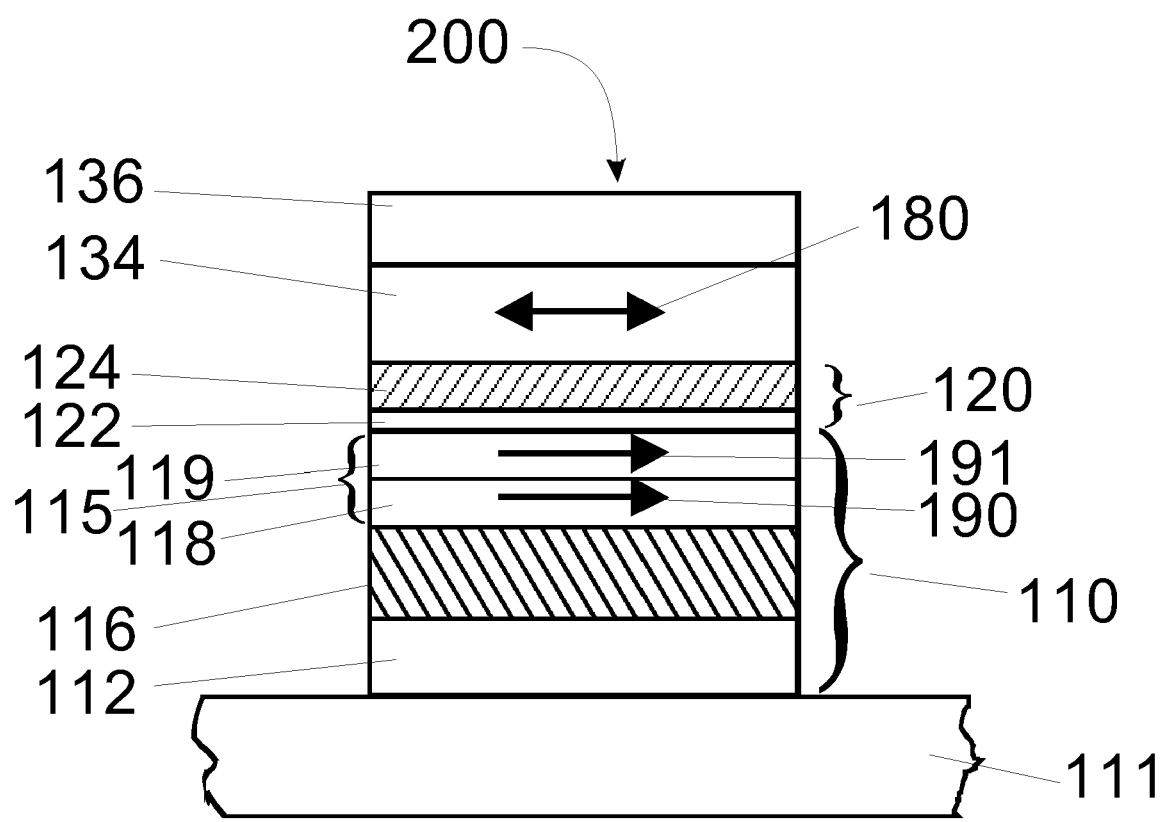
FIG. 2A illustrates the sequence of layers that are deposited to form a magnetic tunnel junction having high tunneling magnetoresistance (TMR).
Figure 2B:
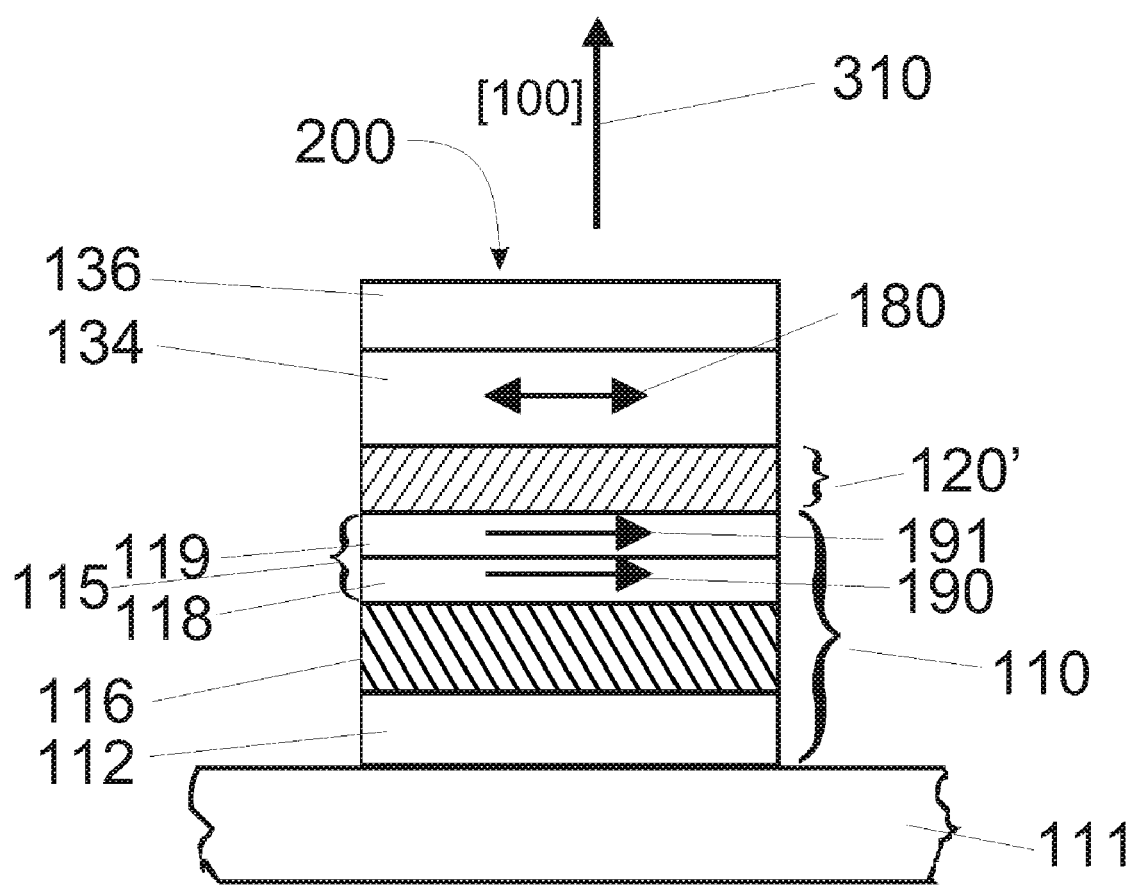
FIG. 2B is a cross sectional view of the magnetic tunnel junction that is formed according to the methodology of FIG. 2A.

FIG. 2A illustrates this process of forming a MTJ 200, in which a tunnel barrier 120 is formed by first depositing a thin Mg layer 122 followed by deposition by reactive sputtering of an MgO layer 124. As shown in FIG. 2B, it is more appropriate to view the MgO tunnel barrier as a single layer 120', since the layer 122 is oxidized to form MgO, with the layers 122 and 124 becoming largely indistinguishable as a result. For example, the layers 122 and 124 are not distinguishable in a cross-sectioned slice of the device examined in a transmission electron microscope. The thickness of the resulting MgO layer 120' is preferably in the range of 3-50 angstroms, more preferably 3-30 angstroms, still more preferably 3-20 angstroms, and most preferably 4-15 angstroms.

Figure 1B:
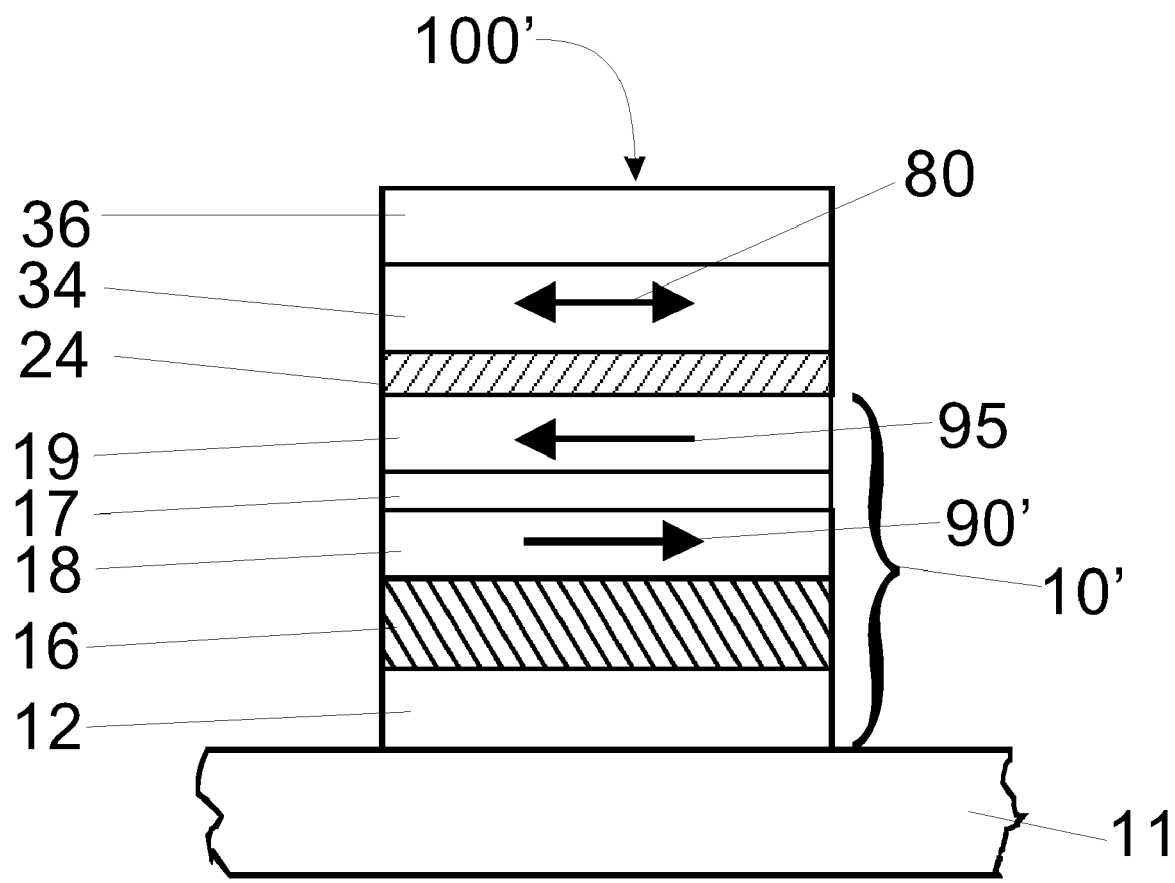

FIG. 2A shows a device that includes a substrate 111, a bottom electrical lead 112, an antiferromagnetic layer 116, a fixed ferromagnetic (or ferrimagnetic) layer 115, a "free" ferromagnetic (or ferrimagnetic) layer 134, and a top electrical lead 136, all of which are similar to their FIG. 1B counterparts 11, 12, 16, 18, 34, and 36, respectively; these layers, as well as other layers and components referred to herein, may be constructed using techniques known to those skilled in the art. The arrows 180 and 190 illustrate possible orientations of the magnetic moments of the free ferromagnetic layer 134 and the fixed ferromagnetic layer 115, respectively. As shown in FIGS. 2A and 2B, the fixed ferromagnetic layer 115 may actually be a bilayer of two different ferromagnetic layers 118 and 119, each having a magnetic moment oriented as indicated by the arrows 190 and 191, respectively. The bilayer 115, the antiferromagnetic layer 116, and the bottom lead 112 of FIGS. 2A and 2B constitute a lower electrode 110.

MTJ structures formed according to the method described in U.S. patent application Ser. No. 10/973,954 to Parkin titled "MgO tunnel barriers and method of formation" (filed Oct. 25, 2004), exhibit very high tunneling magnetoresistance values of more than 160% at room temperature. However, the high tunneling magnetoresistance is derived, not only from using a method of forming the MgO tunnel barrier which does not oxidize the lower ferromagnetic electrode, but also from forming a crystalline structure in which the ferromagnetic electrodes directly above and below the (100) textured MgO tunnel barrier have a bcc crystalline structure and are also textured in the (100) orientation. The layer 115 is preferably formed from a bcc alloy formed from one or more of Co and Fe. For example, layer 118 may be formed from Fe or $Co_{84}Fe_{16}$ and layer 119 may be formed from $Co_{70}Fe_{30}$. The crystallographic texture of these layers can be controlled by suitable choice of the underlayers. For example layer 112 may be formed from a bi-layer of TaN and Ta or from a layer of Ta alone. Layer 116 may be formed from an fcc antiferromagnetic alloy of Ir and Mn where the composition of Ir is less than ~30 atomic percent. The IrMn layer grows highly oriented in the (100) orientation when deposited on the layer 112 formed from Ta or TaN/Ta. The substrate 111 may be comprised of an amorphous material such as $SiO_2$. Using this combination of underlayers, the layer 115, comprised of one or more bcc Co—Fe alloys, is textured in the (100) orientation and the MTJ 200 displays high TMR.

A method of forming $Mg_{1-x}Zn_xO$ tunnel barriers is now described in connection with FIGS. 2A and 2B; $Mg_{1-x}Zn_xO$ tunnel barriers may be used instead of MgO tunnel barriers in the structures disclosed herein to form alternative embodiments. (See also U.S. application Ser. No. 10/982,075 to Parkin titled "Mg—Zn oxide tunnel barriers and method of formation" filed Nov. 5, 2004, which is hereby incorporated by reference.) The $Mg_{1-x}Zn_xO$ tunnel barriers are formed by i) first depositing, for example, a Mg—Zn layer without any oxygen (so that this Mg—Zn layer covers the underlying ferromagnetic or ferrimagnetic layer), and then by ii) depositing, for example, a layer of Mg—Zn in the presence of reactive oxygen during which process the previously deposited first Mg—Zn layer is oxidized, thereby forming the tunnel barrier.

The Mg—Zn composition of the metal layer 122 does not need to be the same as the Mg—Zn composition of the oxide layer 124. Indeed the layer 122 can be formed from pure Mg and the layer 124 can be formed from pure ZnO. Alternatively, the layer 122 can be formed from pure Mg and the layer 124 from $[Mg_{1-x}Zn_x]O$. Alternatively, the layer 122 can be formed from an alloy with a composition $[Mg_{1-y}Zn_y]$, whereas the layer 124 can be formed by the deposition of a layer of composition $[Mg_{1-z}Zn_z]$ in the presence of reactive oxygen. In general, to form a Mg—Zn oxide tunnel barrier according to preferred implementations of the invention herein, it is only necessary that one of the layers 122 and 124 include Mg and that the other of these layers include Zn.

The Zn concentration in the layer 122 can be higher or lower than that of the layer 124. The concentration of Zn in the layer 122 is preferably chosen to optimize the growth of the Mg—ZnO tunneling barrier 120' as well as for the target resistance-area product (RA) value. More Zn will lead to an oxide barrier with a reduced tunnel barrier height and so lower RA. Similarly, increasing the concentration of Zn in the oxide layer 124 will also lead to lower tunneling barrier heights and so to lower RA values. For the optimal tunnel barrier with the highest thermal stability, it may be preferable to form the layer 122 from an alloy of Mg—Zn with less Zn or even from pure Mg. It may also be preferable to form a tunnel barrier by first depositing a layer of Mg or a Mg—Zn alloy with small amounts of Zn, then by secondly depositing a layer of $[Mg_{1-x}Zn_x]$ in the presence of reactive oxygen (in which this layer contains a higher concentration of Zn), then by thirdly depositing a layer of Mg or $[Mg_{1-x}Zn_x]$ with lower concentrations of Zn in the presence of reactive oxygen. (In this case, Mg—Zn oxide tunnel barriers of two or more layers may be formed. These layers may be of the form $[Zn_{1-x}Mg_x]O$, in which the Mg atomic percentage is between 1 and 100, or between 1 and 99.) In general it may be advantageous to form the tunnel barrier 120' from a first layer of Zn or Mg or Mg—Zn, and then by depositing a sequence of Zn or Mg or Mg—Zn additional layers, in which each of the additional layers is formed in the presence of reactive oxygen. The amount of reactive oxygen may be varied from layer to layer. For example, it may be advantageous to have more oxygen for higher concentrations of Zn. It may also be preferable to have less reactive oxygen in the last additional layer onto which the ferromagnetic electrode 134 is subsequently deposited. The Mg—ZnO tunnel barrier 120' so formed may advantageously have a thickness of between 3 and 50 angstroms.

High tunneling magnetoresistance values have been found for a wide composition range of the ternary $[Mg_{1-x}Zn_x]O$ oxides, although the values are not typically as high as those found for oxides without any zinc. Typically, just as for MgO tunnel barriers, the TMR values were increased for thermal annealing at moderate temperatures, although the thermal stability was reduced compared to that of zinc-free MgO tunnel barriers. The thermal stability is very sensitive to the oxidation state of the $[Mg_{1-x}Zn_x]O$ layer, so that the properties of the MTJs are strongly dependent on the reactive sputtering conditions under which these oxide layers are formed, especially to the ratio of argon and oxygen in the sputter gas mixture.

Figure 2C:
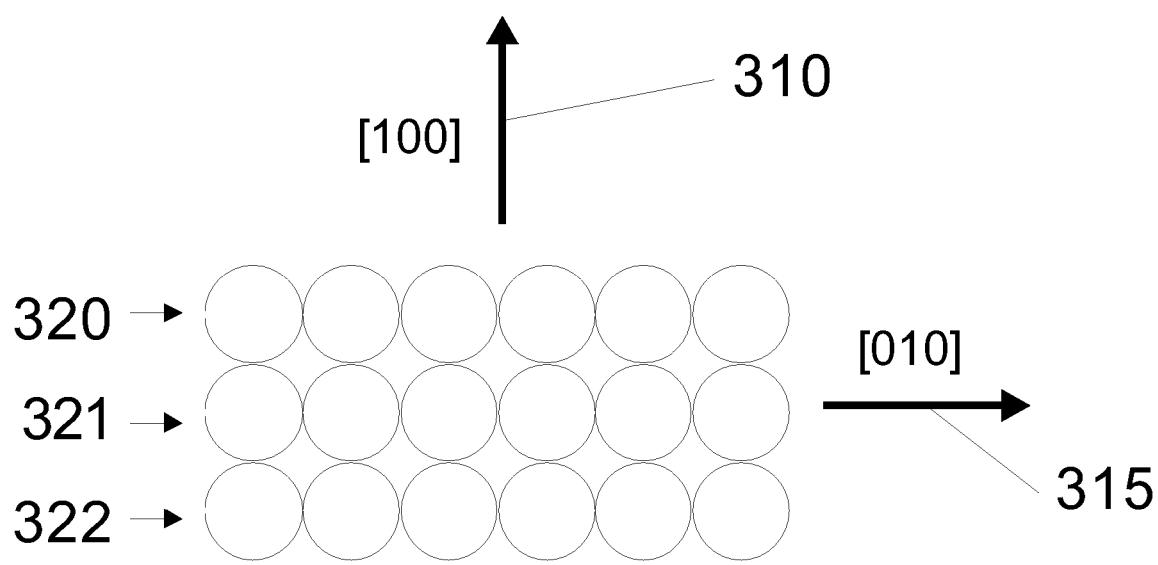
FIG. 2C is a schematic cross-section of the arrangement of the atoms in one of the layers of the textured magnetic tunnel junction formed according to the methodology of FIG. 2A.

The preferred embodiments and implementations of the invention are directed to certain magnetic layers and MgO or Mg—ZnO tunnel barrier layers which are substantially (100) oriented or textured. This is shown schematically in FIG. 2C, which shows the arrangement of atoms in a bcc structure oriented in the (100) direction with respect to the direction of tunneling of electrons. Layers 320, 321, 322 of atoms within an individual grain are shown for rows of atoms oriented along the [010] direction in-plane (indicated by the arrow 315) and (100) direction perpendicular to the plane (indicated by the arrow 310).

The pending applications to Parkin referenced above describe MTJs with high tunneling magnetoresistance using MgO tunnel barriers which use bcc CoFe or Fe electrodes; the use of amorphous ferromagnetic electrodes is described U.S. patent application Ser. No. 10/884,831 to Parkin titled "High performance magnetic tunnel barriers with amorphous materials" filed Jul. 2, 2004. As described above, however, it may also be useful to use ferromagnetic or ferrimagnetic materials which are neither bcc nor amorphous.

The read performance of MTJ devices for MRAM applications is strongly influenced by the magnitude of the tunneling magnetoresistance. MTJs with amorphous alumina tunnel barriers are limited to tunneling magnetoresistance (TMR) values of up to ~70% at room temperature and low voltage bias. The use of MgO tunnel barriers formed in accordance with the methods described herein gives rise to TMR values as high as 220% (see Parkin et al., "Giant Tunneling Magnetoresistance at Room Temperature with MgO (100) Tunnel Barriers," Nature Mater. 3, 862-867 (2004)). However, the MgO tunnel barriers are crystalline, and although the tunnel barriers can be highly crystallographically textured in various orientations (for examples, 100 and 111) depending on the use of different underlayers on which the lower ferromagnetic electrode is deposited, the MgO layer is comprised of individual crystallites of grains whose in-plane orientation varies from grain to grain. This means that the crystal structure of the ferromagnetic electrode deposited on top of this barrier will, to a greater or lesser extent, be influenced by the structure of the MgO layer.

For ferromagnetic electrodes formed from bcc CoFe alloys (as described in U.S. patent application Ser. No. 10/973,954 to Parkin titled "MgO tunnel barriers and method of formation" filed Oct. 25, 2004) the crystal grains from which the CoFe layer is comprised grow in an epitaxial relationship with those of the underlying MgO layer. Since CoFe alloys exhibit significant crystalline magnetic anisotropy, this means that the magnetic moments of the CoFe crystallites will be oriented in different directions in the plane of the CoFe film. Moreover, the anisotropy can be significant. As the size of MTJ devices shrinks to deep sub-micron dimensions, the number of crystallites will be reduced so that there will likely be significant variations in the magnetic switching characteristics (easy and hard axis coercive fields and hard axis anisotropy) of the storage layer of individual MTJ elements. This effect can be mitigated by the use of amorphous ferromagnetic layers, preferably formed from CoFeB alloys, as described in the pending applications to Parkin titled "High performance magnetic tunnel barriers with amorphous materials" (application Ser. No. 10/884,831 filed Jul. 2, 2004) and "Magnetic tunnel junctions using amorphous materials as reference and free layers" (application Ser. No. 10/904,449 filed Nov. 10, 2004). However, the use of amorphous CoFeB layers requires that these layers not be heated to temperatures above their respective crystallization temperature, which may be as low as ~300 C. The crystallization temperature can be increased by forming the CoFeB alloy on an amorphous material such as alumina.

In this patent application the use of bilayer tunnel barriers formed from a combination of a crystalline MgO (or Mg—ZnO) layer and an amorphous layer of alumina is described. There have been reports of the use of bilayer tunnel barriers but none has shown high TMR at room temperature. In U.S. Pat. No. 6,359,289 to Parkin titled "Magnetic tunnel junction device with improved insulating tunnel barrier", bilayer tunnel barriers formed from oxides and nitrides of Al, Ga and In are described, which result in lower tunnel barrier heights than from single layers of Al oxide. In U.S. Pat. No. 6,347,049 titled "Low resistance magnetic tunnel junction device with bilayer or multilayer tunnel barrier", various tunnel barriers formed from multilayers of nitrides and oxides are described. In particular, a barrier containing oxides of both Mg and Al is described that is formed by first depositing an ultrathin layer of metallic Mg followed by an ultra thin layer of metallic Al each 1-4 Å thick. The resulting metallic bilayer is subsequently oxidized by a plasma oxidation process. TMR values no greater than 35% are shown using such a process. Moreover, in contrast with the current invention, the Mg/Al layers of U.S. Pat. No. 6,347,049 are amorphous, being deposited with no particular regard to the crystallographic orientation of the layers on which the metallic bilayer of Mg and Al is deposited.

The current invention uses methods in which a highly oriented layer of crystalline MgO is first formed to provide an interface with a ferromagnetic electrode, preferably formed from Co—Fe or Co—Fe—B alloys, which displays very high tunneling spin polarization. This layer is crystalline and preferably highly oriented in the 100 crystallographic direction. Moreover, this layer is in the form of a dielectric oxide before a layer of amorphous aluminum oxide is deposited in a second step. An advantage of the current invention is that there is much less reactivity between MgO and alumina than between, as in the prior art, metal layers of Mg and Al, which are very likely to form a disordered mixed Mg—Al oxide. Such a disordered oxide does not give rise to highly spin polarized current, and thus MTJs formed from such a bilayer barrier do not show high TMR in contradistinction to the current invention.

The giant tunneling magnetoresistance for MTJs with (100) oriented crystalline MgO tunnel barriers is theorized to be due to coherent tunneling of the electrons across the tunnel barrier and requires crystalline ferromagnetic electrodes whose crystalline structure is matched and aligned with that of the MgO layer. In this invention we show that the requirement of coherently tunneling electrons across the entire tunnel barrier is not needed and that rather the ferromagnet/MgO combination itself gives rise to highly spin polarized electrons. The properties of an MTJ with a bilayer tunnel barrier of $MgO/Al_2O_3$ may be understood by considering that the MTJ has two independent interfaces with two corresponding spin polarization values. Using Julliere's formula, the TMR may then be deduced using the polarization value for the ferromagnet/MgO interface, which is considerably higher than that for the $FM/Al_2O_3$ interface.

The experimental results disclosed herein show that the TMR of a MTJ with a bilayer tunnel barrier formed from crystalline MgO and amorphous $Al_2O_3$ is between the TMR of a MTJ having a single layer of MgO and the TMR of a MTJ having a single layer of $Al_2O_3$. The TMR is directly related to the spin polarization of the electrons tunneling from one FM electrode/dielectric interface to the other dielectric/FM interface. Thus, the polarization of the CoFe/MgO interface is as much as 85% at low temperatures, whereas that of the CoFe/$Al_2O_3$ interface is 55%. Using Julliere's formula (see Phys. Lett. 54A (3), 225-226 (1975)), the TMR may then be deduced using two distinct polarization values for the ferromagnet/MgO interface and the $Al_2O_3$/ferromagnet interface. The polarization of the former is much higher than the latter.

Figure 3A:
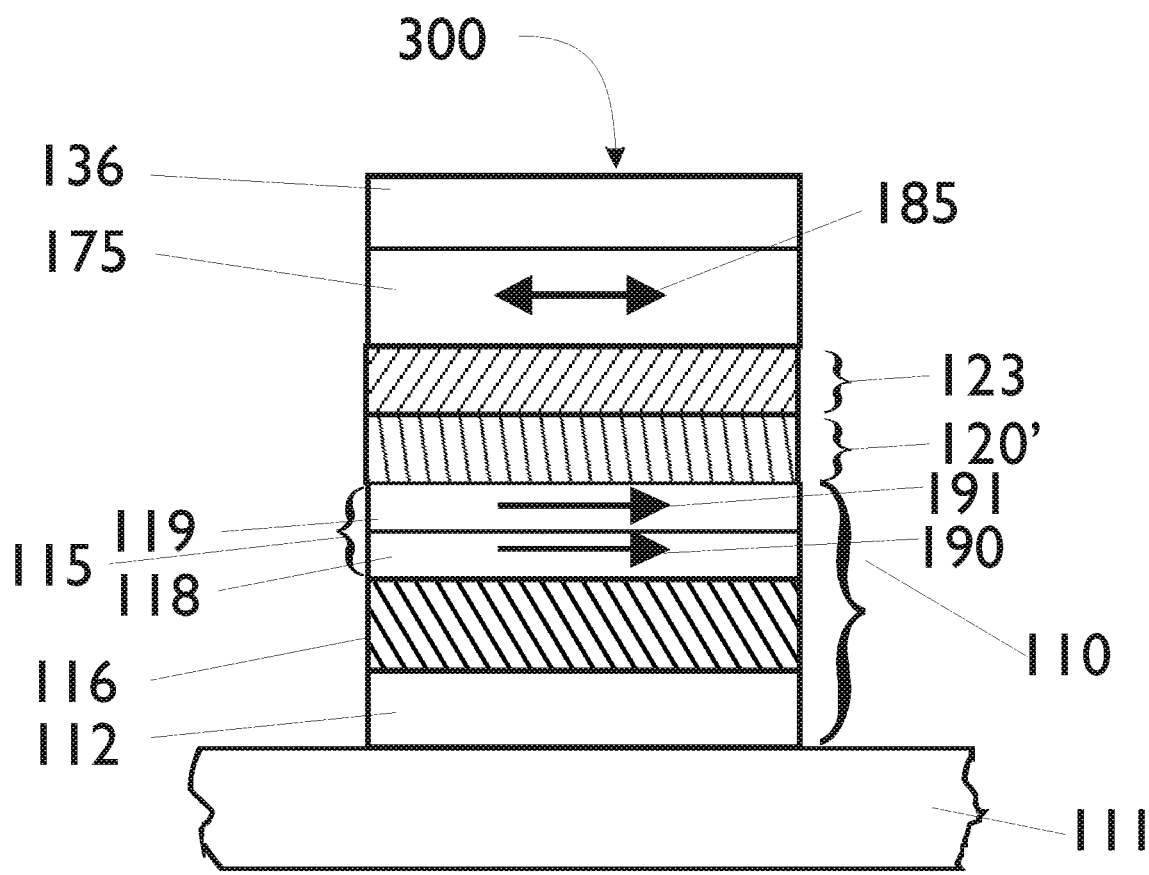
FIGS. 3A and 3B are cross-sectional views of magnetic tunnel junctions of the present invention.

FIG. 3A shows an MTJ device of the current invention that has high tunneling magnetoresistance, with a tunnel barrier formed by first depositing a layer of MgO 120' (as described herein), followed by depositing a second dielectric layer of $Al_2O_3$ 123. The second dielectric layer is amorphous and so is substantially free of crystal grains and their associated grain boundaries. Thus, layers formed from amorphous materials tend to be much flatter than layers formed from crystalline materials. This is advantageous with respect to the properties of ferromagnetic layers formed on such surfaces. In addition to the increased dispersion of magneto-crystalline anisotropy fields for ferromagnetic layers formed on crystalline underlayers, thin ferromagnetic layers, if rough, can display the well-known Neel orange-peel coupling with the ferromagnetic layer on the opposing side of the intervening layer.

Grain boundaries in crystalline tunnel barriers can also lead to "weak" spots in the tunnel barrier where electrical current passed through the tunnel barrier may preferentially tunnel. The increased local density of current will likely increase the probability of electrical breakdown at lower bias voltages than would otherwise be the case for layers without such "hot spots".

Preferred structures and methods of forming certain MTJ devices are now described. The structures are formed by magnetron sputtering using an argon sputter gas at a pressure of 3 mTorr unless otherwise stated. All the layers are formed at ambient temperature. The MTJ device shown in FIG. 3A has an exchange biased reference electrode 110 formed beneath the $MgO/Al_2O_3$ bilayer tunnel barrier (120'/123). The magnetic state of the reference electrode 110 remains unchanged during the operation of the device. The antiferromagnetic layer 116 is used to set the direction of the moment of the ferromagnetic layer 115 by exchange bias. The direction of the exchange bias field is set either during the fabrication of the MTJ device or by heating the device above the blocking temperature of the antiferromagnetic layer and cooling the device in the presence of a magnetic field that is sufficiently large to align the moment of the layer 115 along a given direction. Although use of the antiferromagnetic layer 116 is preferred, the device may be built without it. The direction of the reference electrode 115 is then maintained during the operation of the device by providing a uniaxial anisotropy field. This may be provided by the intrinsic magneto-crystalline anisotropy of the layer 115, or it may be provided by the shape anisotropy of the reference electrode or by other means.

In FIG. 3A the direction 185 of the magnetization of the storage layer 175, located above the upper layer of the tunnel barrier 123, is maintained either parallel or antiparallel to that of the layer 115 (on the other side of the bilayer tunnel barrier) during the operation of the device. The MTJ device of FIG. 3A may also be inverted, such that the reference ferromagnetic electrode is formed above the tunnel barrier and the storage layer is formed beneath the tunnel barrier.

Likewise, the device may be formed so that the $Al_2O_3$ tunnel barrier 123 is positioned above or below the crystalline tunnel barrier 120'. In some situations, it may be preferable to first form an alumina layer followed by a crystalline layer of MgO. As shown in US Patent applications to Parkin titled "High performance magnetic tunnel barriers with amorphous materials" (application Ser. No. 10/884,831 filed Jul. 2, 2004) and "Magnetic tunnel junctions using amorphous materials as reference and free layers" (application Ser. No. 10/904,449 filed Nov. 10, 2004), MgO layers can be grown crystalline and highly 100 oriented when deposited on an amorphous underlayer. Similarly, MgO can be grown highly 100 oriented when deposited on an amorphous layer of alumina. When the MgO layer is deposited on $Al_2O_3$, it may not be necessary to use an Mg underlayer, but the MgO layer may be directly deposited by reactive magnetron sputtering from a Mg target using an argon-oxygen gas mixture.

In FIG. 3A, the substrate 111 is formed from an amorphous layer of $SiO_2$ formed on a silicon substrate. The underlayer or bottom electrical lead 112 is comprised of 100 Å TaN followed by 75 Å Ta. The TaN layer is formed by reactive sputtering of Ta in an Ar—$N_2$ mixture containing 6% $N_2$. An antiferromagnetic layer 116 of 250 Å thick IrMn is deposited on the TaN layer by ion beam sputter deposition using a beam of energetic krypton ions from an rf plasma ion source. The sputtering target used to form the IrMn layer has a composition of $Ir_{22}Mn_{78}$. Next, a ferromagnetic layer 118 of 15 Å thick $Co_{86}Fe_{14}$ is sputter deposited followed by a layer 119 of $Co_{70}Fe_{30}$. The moments of the layers 118 and 119 are parallel to one another because these layers are strongly ferromagnetically exchange coupled; thus they act as a single ferromagnetic layer 115. The directions of the magnetic moments of the layers 118 and 119 are shown as the arrows 190 and 191, respectively in FIG. 3A. The reference ferromagnetic layer 115 may also be formed from a single ferromagnetic layer which may be comprised of a Co—Fe alloy whose structure is bcc or from a layer of pure Fe or from an amorphous CoFeB layer, for example.

An MgO layer 120' is then formed on top of the lower ferromagnetic electrode 110 using the method described in U.S. patent application Ser. No. 10/973,954 to Parkin titled "MgO tunnel barriers and method of formation" (filed Oct. 25, 2004), by first depositing a thin layer of Mg having a thickness in the range of 3 to 20 Å, for example, followed in a second step by the deposition of a layer of Mg in the presence of reactive oxygen. The thickness of the second layer, which is comprised of MgO, is typically in the range from 3 to 20 Å depending on the desired resistance-area product, which can range up to more than $10^9\Omega(\mu m)^2$. For the device of FIG. 3A, a Mg layer 8 Å thick was used, followed by an MgO layer 28 Å thick formed by reactive magnetron sputtering using an argon-oxygen plasma containing 3 atomic percent oxygen. During the deposition of the MgO layer, the Mg underlayer becomes oxidized so that the two layers form a single MgO tunnel barrier. The exact composition of the MgO layer may differ slightly from the stoichiometric composition but Rutherford backscattering data on companion films of MgO, 500 Å thick, show that, within experimental error, the MgO layer contains 50 atomic percent 0 and 50 atomic percent Mg.

A layer of alumina 123 is then deposited on top of the crystalline layer 120' by reactive sputtering from an aluminum target in the presence of an argon-oxygen gas mixture. The proportion of oxygen in the gas mixture depends on the detailed configuration of the sputter deposition system and the rate of flow of sputtering gas into the deposition system. Typical concentrations of oxygen are in the range from 2 to 10 atomic percent but preferred concentrations use as little oxygen as possible. For the structure shown in FIG. 3A, the flow of oxygen into the sputter chamber was 2.5 percent of that of the flow of argon into the chamber. The alumina layer can also be formed by the evaporation of aluminum metal from a Knudsen cell in the presence of atomic oxygen formed from an rf discharge in an enclosed cavity within the deposition chamber. This method has the advantage of using much lower concentrations of oxygen. In another method, the alumina layer can be formed by ion beam sputter deposition from a metallic aluminum target in the presence of reactive oxygen, for example, formed within an atomic oxygen source. The alumina layer 123 may also be formed by sputter-deposition (either rf magnetron or ion beam) from an insulating target of alumina.

The alumina layer 123 may also be formed by first depositing a thin layer of aluminum metal and then plasma-oxidizing this layer using reactive oxygen either from an atomic oxygen source or from an oxygen plasma created in the vicinity of the aluminum layer and preferably with the application of a bias voltage of a few volts to the sample substrate. The alumina layer 123 is preferably grown with a thickness in the range from 2 to 30 angstroms and more preferably with a thickness in the range from 2 to 20 angstroms.

Next, the MTJ device shown in FIG. 3A is completed by forming the top ferromagnetic electrode 175, which is the storage layer. In FIG. 3A the storage layer can actually be comprised of two ferromagnetic layers. First a thin layer of 20 Å $Co_{70}Fe_{30}$ is deposited on the MgO tunnel barrier 120'. Second, an amorphous ferromagnetic layer is formed (over the thin $Co_{70}Fe_{30}$ layer), which is here comprised of 100 Å thick $(Co_{70}Fe_{30})_{85}B_{15}$. This amorphous layer is formed by magnetron sputtering in a pure argon plasma where a target of composition $(Co_{70}Fe_{30})_{80}B_{20}$ is used. The composition of the film and that of the target may be significantly different, especially when the target is comprised of elements which are significantly different in atomic mass or which have significantly different sputter yields. The composition of the film was checked with Rutherford back scattering (RBS) on companion films made in the same deposition sequence which were ~1000 Å thick. The preferred thickness of the amorphous CoFeB layer is in the range from 10 to 30 angstroms, and the preferred thickness of the thin CoFe layer is in the range from 5 to 12 angstroms. Alternatively, the storage layer 175 may be formed from a single layer composed of either the thin CoFe layer or the amorphous layer; in this case, the preferred thickness of the single layer is in the range from 10 to 40 angstroms.

Finally, the device 300 of FIG. 3A is completed by forming a capping layer 136 which is comprised of 100 Å TaN followed by 75 Å Ru. The TaN layer is formed by reactive magnetron sputtering using an argon-nitrogen plasma containing about 8% nitrogen. The Ru layer is formed by ion beam sputtering. The amount of nitrogen in the sputter gas mixture may be different for the growth of the capping layer 136 and the underlayer 112, in order to optimize the thermal stability of the structure and the crystallographic texture of the MgO barrier for the highest tunneling magnetoresistance values.

Figure 4:
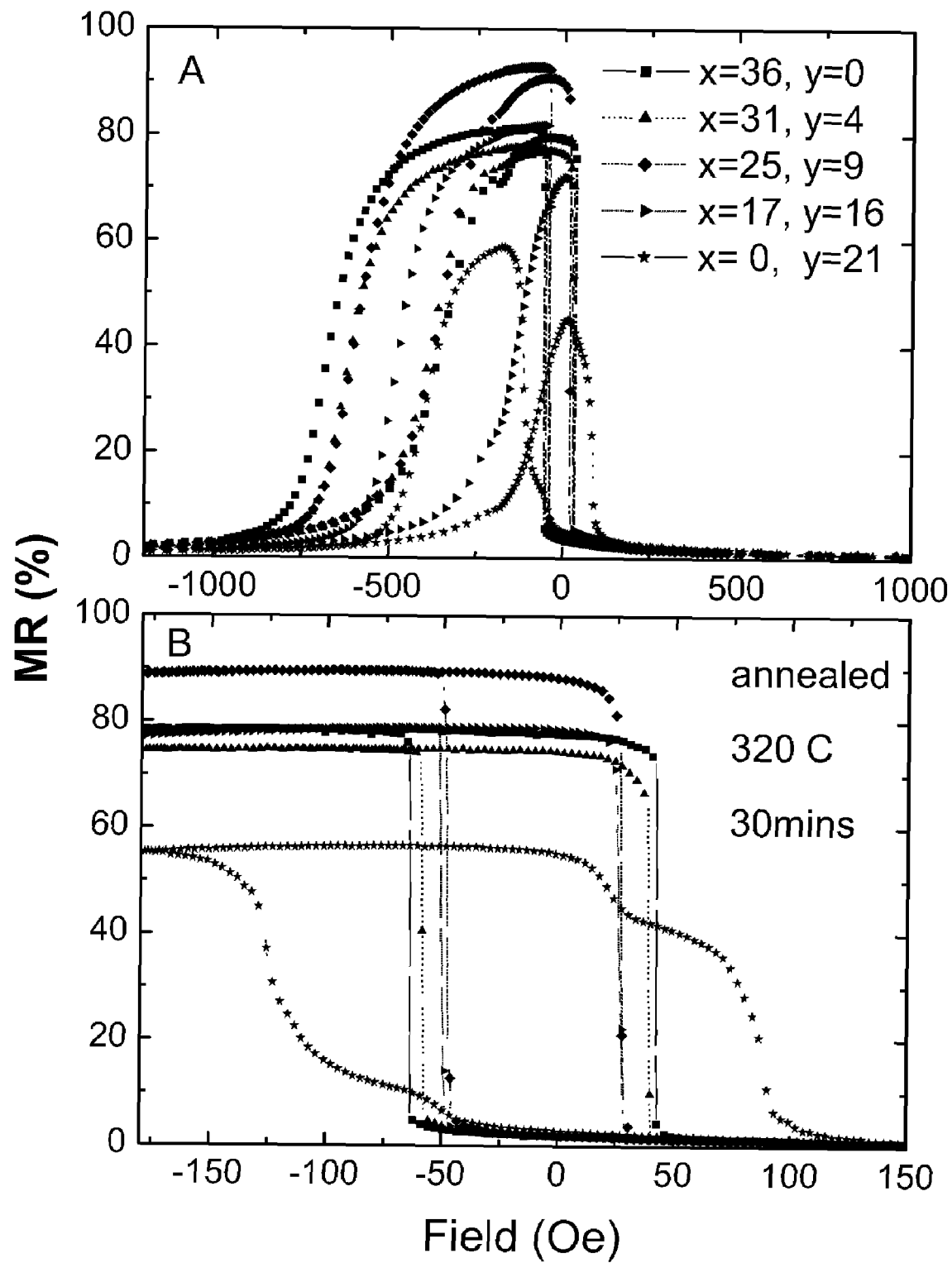
FIG. 4, which includes

Resistance versus field curves for several completed devices of FIG. 3A are shown in FIG. 4. For the devices of FIG. 4 the reference layer is formed from a single layer 119 of 40 Å $Co_{70}Fe_{30}$, the MgO layer 120' is formed by first depositing 10 Å Mg followed by a MgO layer of thickness x which was varied from 2 to 26 Å. Then an alumina layer 123 was formed of thickness y which was varied from 0 to 20 Å. The thickness of the MgO layer 120' comprises the nominal thickness of the Mg underlayer, which is about 10 angstroms in each case, plus the nominal thickness of the deposited MgO layer. The Mg layer becomes oxidized during the deposition of the MgO layer, but its thickness will not be much changed. Thus, the thickness x indicated in FIG. 4 is that of the combined Mg+MgO layer thicknesses. The alumina layer was deposited by dc magnetron reactive sputtering without a metallic aluminum underlayer except for the case of the device having a barrier formed from a single layer of $Al_2O_3$. In this case a metallic underlayer of Al, 3 angstroms thick, was first deposited.

The data in FIG. 4 show that MTJs can be formed with bilayer tunnel barriers of $MgO/Al_2O_3$, and may have nearly the same TMR values as a structure having a tunnel barrier of similar total thickness but grown without any alumina, for structures annealed at moderate temperatures. (This is also evident from FIGS. 5-7 below.) At higher anneal temperatures, the TMR of MTJs having MgO barriers formed according to the current invention can be considerably increased (see U.S. patent application Ser. No. 10/973,954 to Parkin titled "MgO tunnel barriers and method of formation" filed Oct. 25, 2004). The TMR values for the bilayer MTJs herein are much higher than have previously been observed for MTJs formed with an alumina tunnel barrier alone. Thus, the use of bilayer tunnel barriers formed from a crystalline MgO layer and an amorphous alumina layer are highly advantageous.

Figure 5:
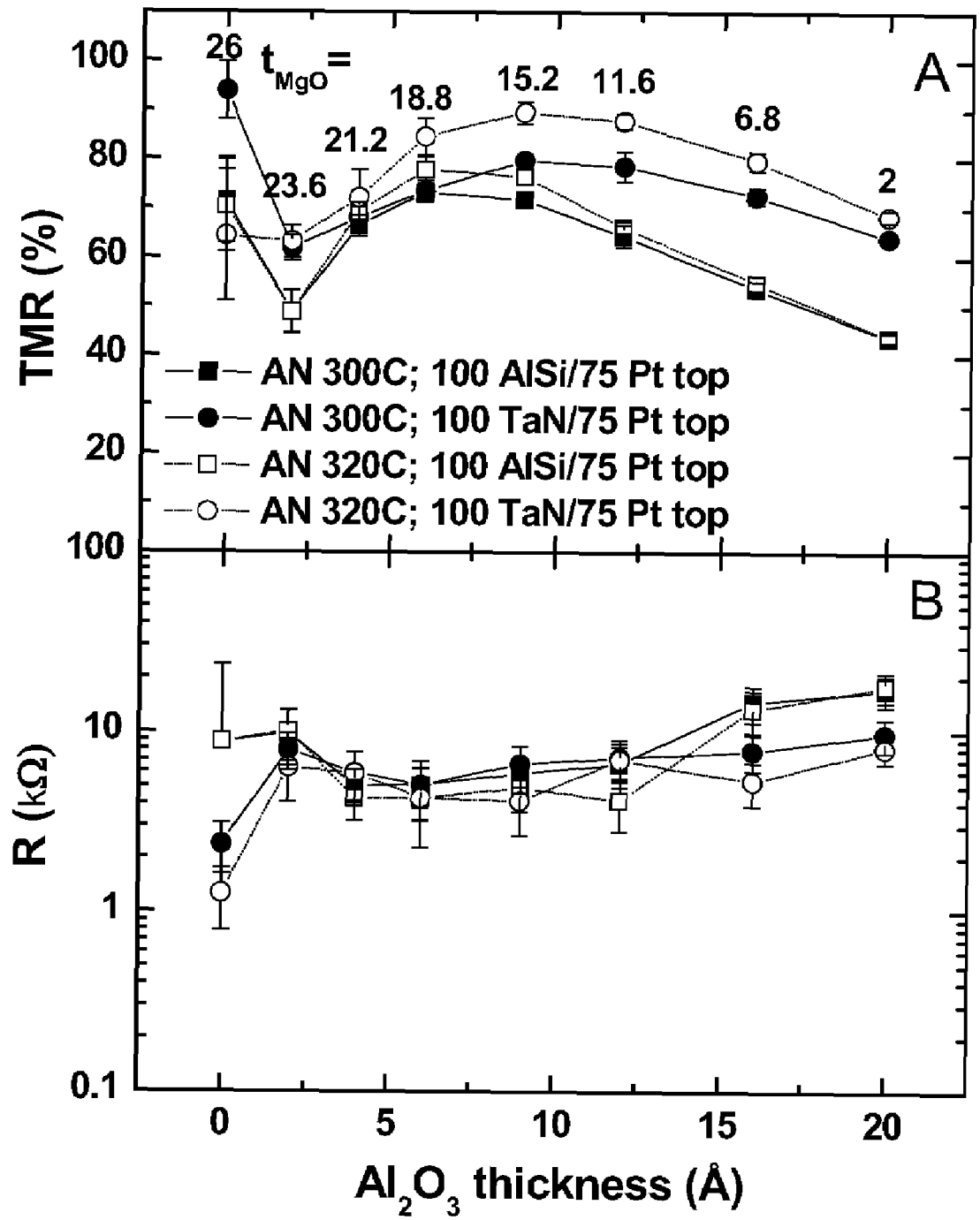
FIG. 5, which includes

FIG. 5 summarizes the dependence of TMR and the corresponding resistance of the device as a function of increasing alumina thickness y. The corresponding thickness of the MgO layer 120' is shown in the figure. The thickness of the MgO layer was varied, so that the resistance of the device was in a suitable range for the study of such devices using shadow masked junctions of size ~100×100 μm². The devices of FIG. 5 are prepared with two different capping layers 136 which are formed from either 100 Å $Al_{98}Si_2$/75 Å Pt or 100 Å TaN/75 Å Pt. Data are also shown for the devices annealed at two different temperatures of 300 C and 320 C.

Figure 3B:
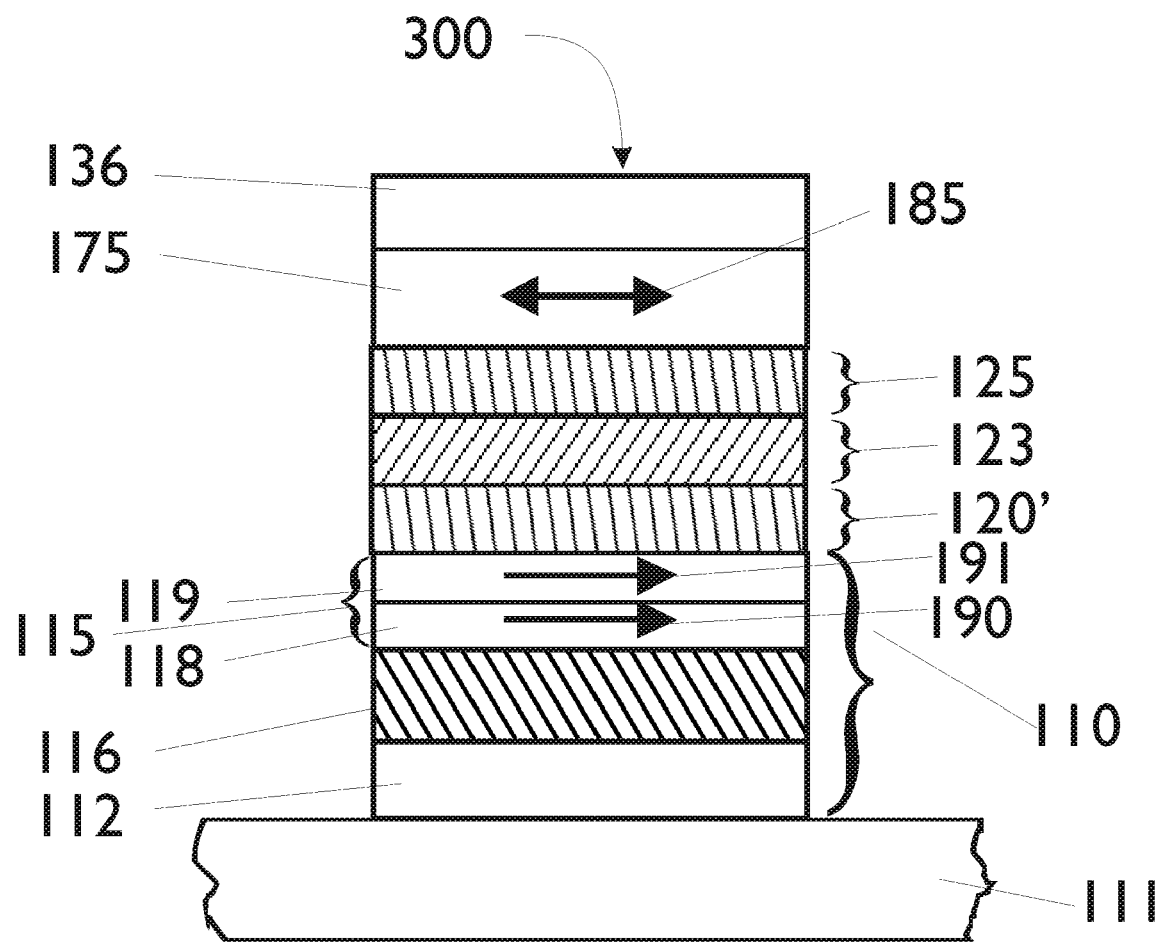

In another preferred embodiment of the current invention, the tunnel barrier is formed from a trilayer comprised of $MgO/Al_2O_3/MgO$, as illustrated in FIG. 3B. After the deposition of the alumina layer 123, a second MgO layer 125 is formed by methods similar to those used to form the layer 120' except that the Mg underlayer is not required.

Figure 6:
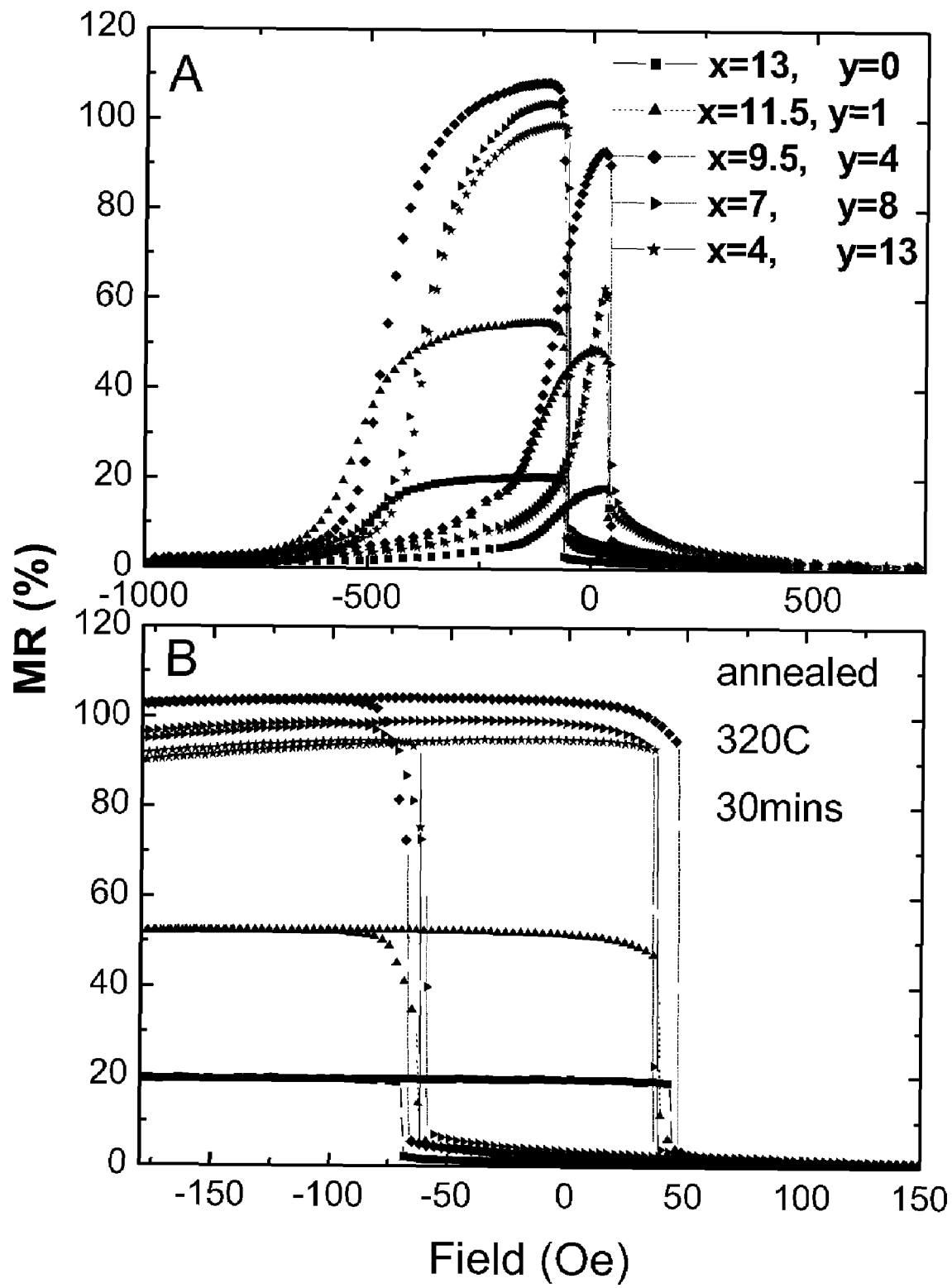
FIG. 6, which includes

FIG. 6 shows resistance versus field data for structures of the form of FIG. 3B where the thickness y of the alumina layer 123 is varied in concert with variations of the thickness x of the upper MgO layer 125. Again very high TMR values are obtained exceeding 100% at room temperature, values which are much higher than have previously been obtained with amorphous alumina tunnel barriers. The thickness of the upper MgO layer 125 is shown in the figure. This MgO layer is formed without an Mg underlayer. By contrast the lower MgO layer 120' is formed with an Mg underlayer that was nominally 10 angstroms thick. The thickness of the lower MgO layer was comprised of the Mg underlayer plus a MgO layer of the same thickness as the upper MgO layer x. Thus the lower MgO layer is thicker in each case than that of the upper MgO layer by approximately 10 angstroms.

Figure 7:
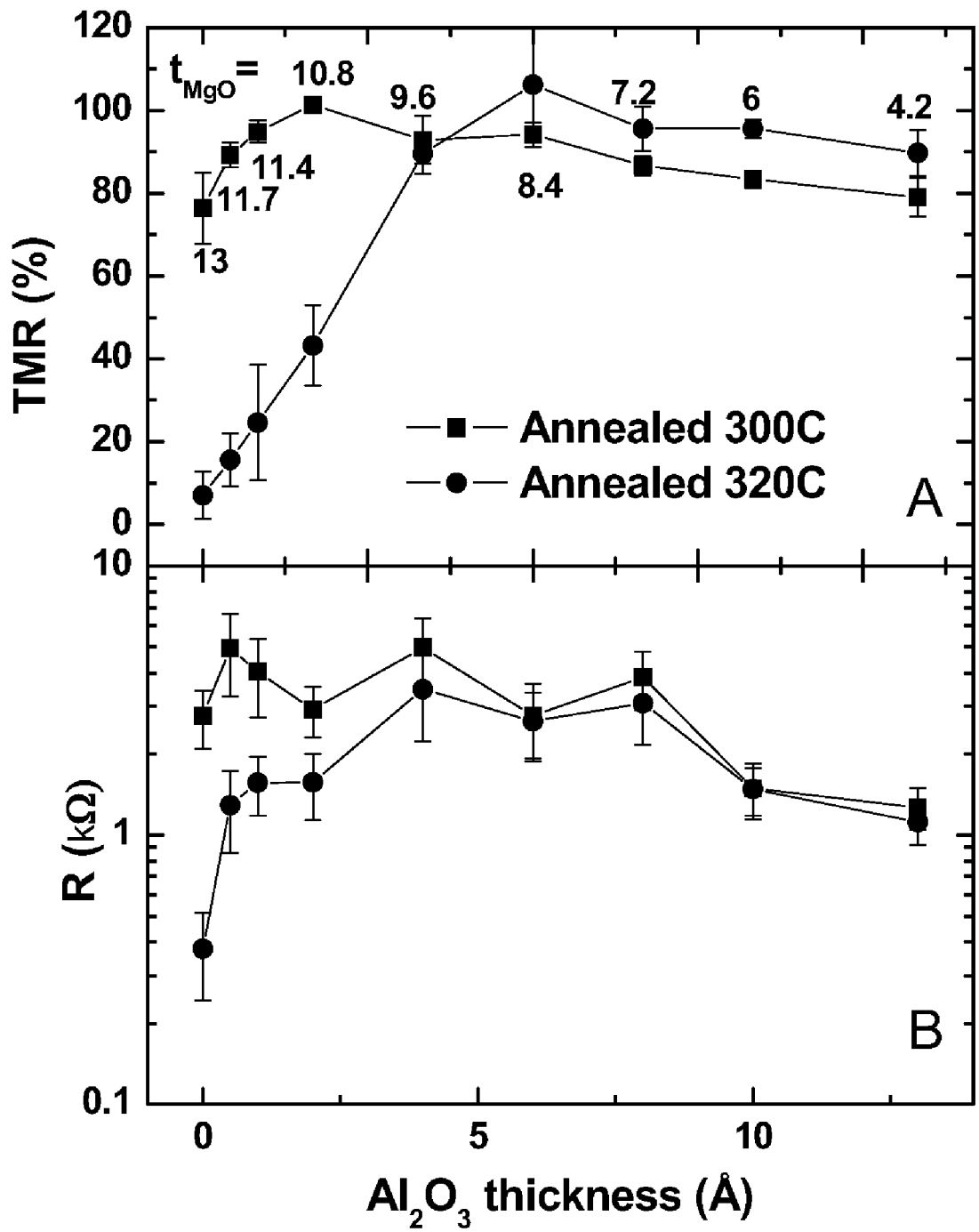
FIG. 7, which includes

The dependence of TMR and resistance of the shadow masked tunnel junction devices are shown as a function of alumina thickness in FIG. 7. For these samples, the capping layer is formed from 100 Å TaN/75 Å Pt. For these devices, the alumina thickness is preferably greater than ~4 Å. For thinner alumina layers, the robustness of these devices with thermal anneal treatments is reduced.

Figure 8:
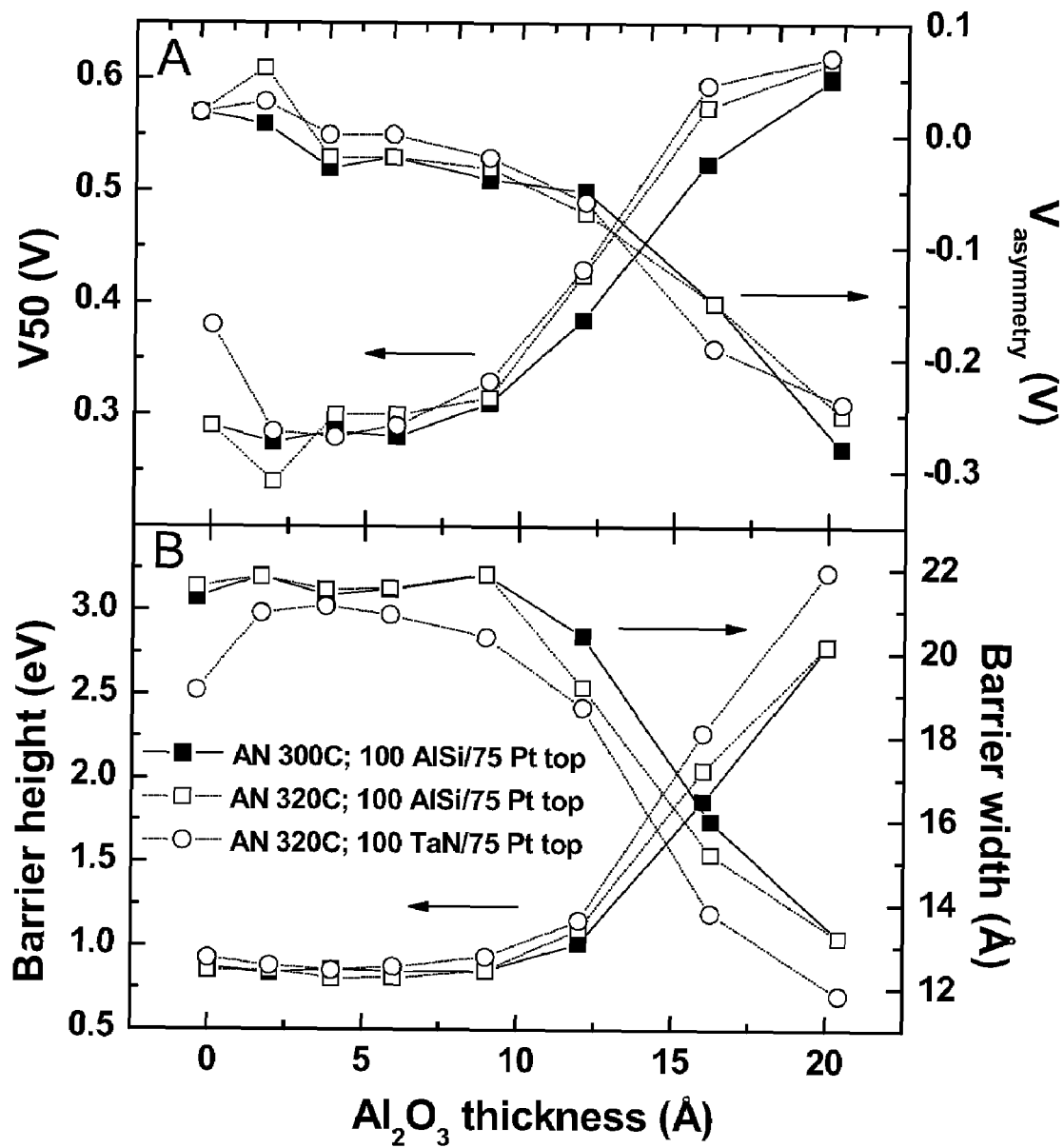
FIG. 8, which includes

Finally, FIG. 8A summarizes a particular advantage of the use of MgO/alumina bilayer tunnel barriers by illustrating that the reduction of TMR with increasing bias voltage is much reduced for bilayer tunnel barriers compared to MgO tunnel barriers. Typically in MTJs it is found that the TMR decreases with increasing voltage bias and this dependence is often characterized by the voltage $V_{50}$ at which the TMR is reduced by one half. As shown in FIG. 8 the $V_{50}$ values are almost doubled when thin layers of alumina exceeding ~12 Å are included in the tunnel barrier. The increased $V_{50}$ values are correlated with an increased tunnel barrier height as shown in FIG. 8B. The values of $V_{50}$ for positive and negative bias voltages are slightly different. The difference in these voltages is shown on the right hand side of the plot in FIG. 8A. The tunnel barrier height is inferred from fitting the current versus voltage curves with the standard Brinkman model as discussed in W. F. Brinkman, R. C. Dynes, and J. M. Rowell, "Tunneling conductance of asymmetrical barriers," J. Appl. Phys. 41 (5), 1915 (1970). The tunnel barrier width is another parameter in these fits and is also shown in FIG. 8B (right ordinate).

While the preferred embodiments of the current invention apply to structures with (100) texturing for the highest possible TMR or spin polarization values, the structures and devices described herein may be prepared in other crystallographic orientations, such as (111), and so be advantageous in other regards.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A device, comprising:
   a tunnel barrier structure that includes a crystalline MgO tunnel barrier in proximity with an $Al_2O_3$ tunnel barrier; and
   first and second magnetic materials on different sides of the tunnel barrier structure, wherein:
   i) the first magnetic material, the MgO tunnel barrier, the $Al_2O_3$ tunnel barrier, and the second magnetic material are in proximity with each other, thereby enabling spin-polarized current to pass from the first magnetic material, through the tunnel barriers, and into the second magnetic material; and
   ii) the first and second magnetic materials are selected from the group of materials consisting of ferromagnetic materials and ferrimagnetic materials.

2. The device of claim 1, wherein the thickness of the $Al_2O_3$ tunnel barrier is less than 30 angstroms.

3. The device of claim 1, wherein the thickness of the $Al_2O_3$ tunnel barrier is between 2 and 20 angstroms.

4. The device of claim 1, wherein the thickness of the MgO tunnel barrier is less than 50 angstroms.

5. The device of claim 1, wherein the thickness of the MgO tunnel barrier is between 3 and 20 angstroms.

6. The device of claim 1, wherein the tunnel barriers and the magnetic materials form a magnetic tunnel junction having a tunneling magnetoresistance of at least 50% at room temperature.

7. The device of claim 1, wherein the tunnel barriers and the magnetic materials form a magnetic tunnel junction having a tunneling magnetoresistance of at least 100% at room temperature.

8. The device of claim 1, wherein the $Al_2O_3$ tunnel barrier is substantially amorphous.

9. The device of claim 1, wherein the $Al_2O_3$ tunnel barrier is sufficiently thick that a surface of the MgO tunnel barrier is substantially covered by the $Al_2O_3$ tunnel barrier.

10. The device of claim 1, wherein the MgO tunnel barrier is (100) oriented.

11. The device of claim 1, wherein the MgO tunnel barrier is (111) oriented.

12. The device of claim 1, wherein the tunnel barrier structure includes at least two MgO tunnel barriers, and the $Al_2O_3$ tunnel barrier is sandwiched between two MgO tunnel barriers.

13. A device, comprising:
a tunnel barrier structure that includes a crystalline tunnel barrier in proximity with an amorphous tunnel barrier, wherein the crystalline tunnel barrier and the amorphous tunnel barrier have different chemical compositions;
a first layer of magnetic material; and
a second layer of magnetic material, wherein:
i) the first magnetic layer, the tunnel barrier structure, and the second magnetic layer are in proximity with each other, thereby enabling spin-polarized current to pass from the first magnetic material, through the tunnel barrier structure, and into the second magnetic material; and
ii) the magnetic materials of the first and second layers are selected from the group of materials consisting of ferromagnetic materials and ferrimagnetic materials.

14. The device of claim 13, wherein the crystalline tunnel barrier includes a (100) oriented MgO tunnel barrier.

15. The device of claim 13, wherein the crystalline tunnel barrier includes a (111) oriented MgO tunnel barrier.

16. The device of claim 13, wherein the crystalline tunnel barrier includes a Mg—ZnO tunnel barrier.

17. The device of claim 13, wherein the amorphous tunnel barrier includes an $Al_2O_3$ tunnel barrier.

18. A magnetic tunnel junction, comprising:
a first layer of magnetic material selected from the group of materials consisting of ferromagnetic materials and ferrimagnetic materials;
a second layer of magnetic material selected from the group of materials consisting of ferromagnetic materials and ferrimagnetic materials; and
a bilayer of respective tunnel barriers, the bilayer being sandwiched between the first and second magnetic layers, so that the first layer, the bilayer, and the second layer form a magnetic tunnel junction, wherein:
the bilayer includes i) a layer of amorphous $Al_2O_3$ that forms a first tunnel barrier and ii) a layer of crystalline material that forms a second tunnel barrier, the crystalline material including at least one of MgO and Mg—ZnO.

19. The magnetic tunnel junction of claim 18, wherein the thickness of the $Al_2O_3$ layer is less than 30 angstroms.

20. The magnetic tunnel junction of claim 18, wherein the bilayer includes a MgO tunnel barrier having a thickness of less than 50 angstroms.

21. The magnetic tunnel junction of claim 18, wherein the bilayer includes a MgO tunnel barrier having a thickness of between 3 and 20 angstroms.

22. The magnetic tunnel junction of claim 18, wherein the tunnel barriers and the magnetic layers form a magnetic tunnel junction having a tunneling magnetoresistance of at least 50% at room temperature.

23. The magnetic tunnel junction of claim 18, wherein the tunnel barriers and the magnetic layers form a magnetic tunnel junction having a tunneling magnetoresistance of at least 100% at room temperature.

24. The magnetic tunnel junction of claim 18, wherein the bilayer includes a (100) oriented MgO tunnel barrier.

25. The magnetic tunnel junction of claim 18, wherein the bilayer includes a (111) oriented MgO tunnel barrier.

* * * * *